United States Patent
Takauchi et al.

(10) Patent No.: US 7,154,918 B2
(45) Date of Patent: Dec. 26, 2006

(54) MULTIPLEXER CIRCUIT FOR CONVERTING PARALLEL DATA INTO SERIAL DATA AT HIGH SPEED AND SYNCHRONIZED WITH A CLOCK SIGNAL

(75) Inventors: Hideki Takauchi, Kawasaki (JP); Kohtaroh Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1005 days.

(21) Appl. No.: 10/107,052

(22) Filed: Mar. 28, 2002

(65) Prior Publication Data

US 2003/0076821 A1 Apr. 24, 2003

(30) Foreign Application Priority Data

Oct. 19, 2001 (JP) ............................. 2001-322375

(51) Int. Cl.
*H04J 3/02* (2006.01)
(52) U.S. Cl. ........................................ 370/537; 327/407
(58) Field of Classification Search ................ 370/537; 327/407, 408, 409, 410, 411, 412, 413
See application file for complete search history.

(56) References Cited

U.S. PATENT DOCUMENTS

| | | | |
|---|---|---|---|
| 4,932,027 A | 6/1990 | Scharrer | |
| 5,654,660 A | 8/1997 | Orgill et al. | |
| 5,761,208 A * | 6/1998 | Muramatsu | 370/532 |
| 6,188,339 B1 | 2/2001 | Hasegawa | |
| 6,208,193 B1 * | 3/2001 | Moyal et al. | 327/411 |
| 6,310,509 B1 | 10/2001 | Davenport | |
| 2001/0007577 A1 | 7/2001 | Measor | |

FOREIGN PATENT DOCUMENTS

| | | |
|---|---|---|
| EP | 1 079 300 A1 | 2/2001 |
| JP | 01-309512 | 12/1989 |
| JP | 05-191239 | 7/1993 |
| JP | 09-116405 | 5/1997 |
| JP | 2000-236244 | 8/2000 |

OTHER PUBLICATIONS

W. Dally et al., "Digital Systems Engineering", Cambridge, pp. 536-540, 1998 (Figure 11-12 and Figure 11-25).

* cited by examiner

*Primary Examiner*—Melvin Marcelo
(74) *Attorney, Agent, or Firm*—Arent Fox PLLC

(57) ABSTRACT

A multiplexer circuit, converting parallel data into serial data and synchronized with a clock signal, has a plurality of multiplexer cells that receive the parallel data. Each of the multiplexer cells has a first load, a plurality of first conductivity type transistors, and a level-changing circuit. The first conductivity type transistors are connected in series between a first power source line and a second power source line, and the level-changing circuit changes a connection node of adjacent first conductivity type transistors to a level of the first power source line.

14 Claims, 19 Drawing Sheets

MULTIPLEXER CIRCUIT FOR CONVERTING PARALLEL DATA INTO SERIAL DATA AT HIGH SPEED AND SYNCHRONIZED WITH A CLOCK SIGNAL

BACKGROUND OF THE INVENTION

1. Field of the Invention

The present invention relates to a technique for carrying out a high-speed transmission of signals between LSIs or between devices formed by a plurality of LSIs. More particularly, the present invention relates to a multiplexer circuit that converts parallel data into serial data.

2. Description of the Related Art

Recently, the performance of components used in computers and other information processing apparatuses has been greatly improved. In particular, dramatic improvements have been made, for example, in the performance of processors and semiconductor memory devices such as SRAMs (Static Random Access Memories) and DRAMs (Dynamic Random Access Memories). The improvements in the performance of semiconductor memory devices, processors, and the like have come to the point where system performance cannot be improved further unless the speed of signal transmission between components or elements is increased.

Further, in recent years, along with the increase in the operation speed of LSIs, it has become necessary to provide a signal transmission system that can perform high-speed transmission of large-capacity signals between LSIs or between devices constructed of a plurality of LSIs. For example, in network infrastructures, high-speed transmission in the order of gigabits per second is required. As a result, a focus has been placed on a device called a "giga-bit SerDes (serializer and deserializer)".

In the interface circuit that has the SerDes function, it is necessary to convert relatively low-speed parallel data received from a logic circuit that carries out a data processing like a network switching, into high-speed serial data at Gbps speed, and output the converted data, for example. As the data speed has become so fast, it has become necessary to improve time constants by preparing a separate current path, at a portion that has an upper limit in the operation frequency within the LSI circuit. Alternatively, it has become necessary to reduce a power source inductance portion, by using differential signals, in the data processing inside the LSI.

Conventionally, a multiplexer circuit that converts parallel data into serial data carries out a data processing by using multi-phase clock signals, as described in "DIGITAL SYSTEMS ENGINEERING", Cambridge, 1998, by W, Dally et al. (for example, FIGS. 11–12 and FIGS. 11–25). In the conventional multiplexer circuits, it has been difficult to realize a high-speed operation.

The prior art and the problems associated with the prior art will be described in detail later with reference to accompanying drawings.

SUMMARY OF THE INVENTION

An object of the present invention is to provide a multiplexer circuit that can convert parallel data into serial data at high speed and synchronized with clock signals.

According to the present invention, there is provided a multiplexer circuit, having a plurality of multiplexer cells that receive parallel data, for converting the parallel data into serial data, and synchronized with a clock signal, wherein each of the multiplexer cells comprises a first load and a plurality of first conductivity type transistors that are connected in series between a first power source line and a second power source line; and a level-changing circuit that changes a connection node of adjacent first conductivity type transistors to a level of the first power source line.

The multiplexer circuit may take out an output of each of the multiplexer cells from a connection node of the first load and the first conductivity type transistors that are connected in series. A plurality of the level-changing circuits may be provided at different positions of the connection node of the adjacent first conductivity type transistors. The level-changing circuit may be formed by at least one second conductivity type transistor that is connected to the first power source line. The first load may be formed by a second conductivity type transistor.

The level-changing circuit may be formed by a second load that is connected to the first power source line and at least one first conductivity type transistor that is connected in series with the second load. The second load may be formed by a second conductivity type transistor. The first and second loads may be formed by second conductivity type transistors that are connected by cross coupling. The first and second loads may be formed by a parallel layout of second conductivity type transistors that are connected by cross coupling and second conductivity type transistors that are not connected by cross coupling. The first and second loads may be formed by second conductivity type transistors.

The level-changing circuit may maintain the symmetry of the level-changing circuit in layout. The level-changing circuit may be formed by two second conductivity type transistors that are connected to the first power source line. Each of the multiplexer cells may be formed as a differential circuit that processes differential signals. The multiplexer circuit may further comprise a latching circuit that is provided at the outputs of the plurality of multiplexer cells.

The first power source line may be a high-potential power source line, the second power source line is a low-potential power source line, and the first conductivity type transistor may be an nMOS transistor. The second conductivity type transistor may be a pMOS transistor. The multiplexer cells may be four multiplexer cells that are controlled based on four-phase clock signals.

BRIEF DESCRIPTION OF THE DRAWINGS

The present invention will be more clearly understood from the description of the preferred embodiments as set forth below with reference to the accompanying drawings, wherein.

BRIEF DESCRIPTION OF THE PREFERRED EMBODIMENTS

Before describing the embodiments of the present invention in detail, conventional multiplexer circuits and problems of these multiplexer circuits will be explained with reference to the drawings.

Figure 1:
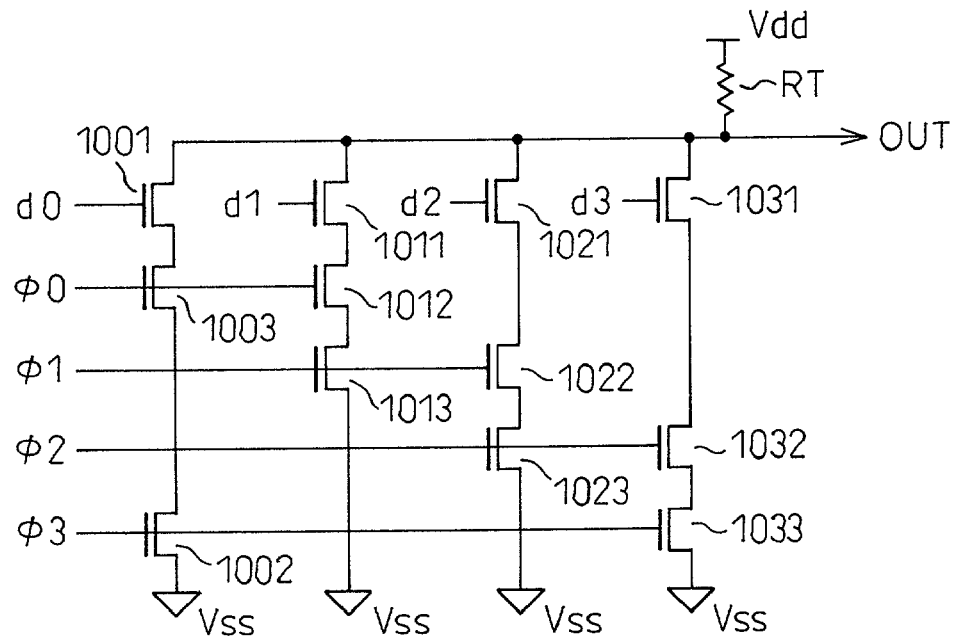
FIG. 1 is a circuit diagram that shows one example of a conventional multiplexer circuit.
Figure 2:
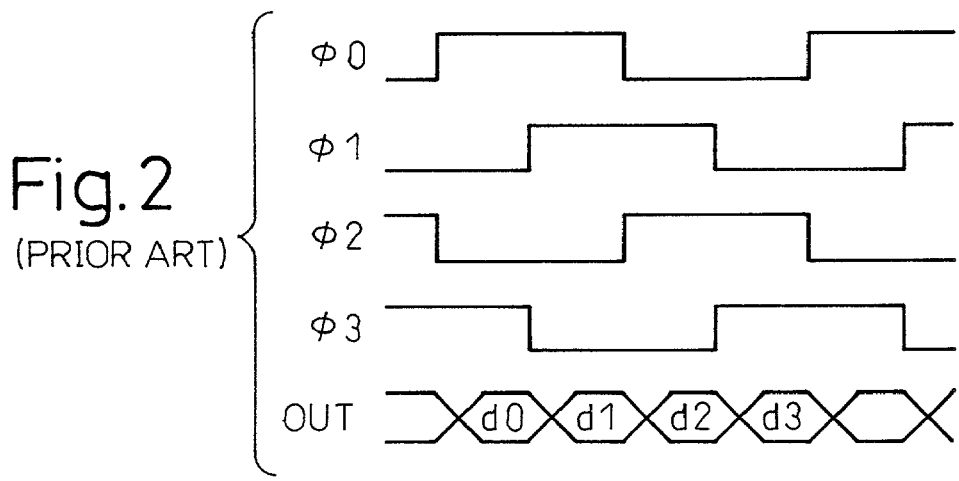
FIG. 2 is a timing diagram for explaining the operation of the multiplexer circuit shown in FIG. 1.

FIG. 1 is a circuit diagram that shows one example of a conventional multiplexer circuit, and FIG. 2 is a timing diagram for explaining the operation of the multiplexer circuit shown in FIG. 1. FIG. 1 and FIG. 2 correspond to FIGS. 11–22 of the above-described literature. In FIG. 1, reference numbers 1001 to 1003, 1011 to 1013, 1021 to 1023, and 1031 to 1033 denote n-channel type MOS transistors (nMOS transistors). RT denotes a resistance, φ0 to φ3 denote four-phase clock signals that have their phases mutually separated by 90 degrees respectively, and d0 to d3 denote parallel data.

As shown in FIG. 1, parallel data d0, d1, d2 and d3 are supplied to the gates of the transistors (input transistors) 1001, 1011, 1021 and 1031, respectively. Clock signals (φ3 and φ0), (φ0 and φ1), (φ1 and φ2), and (φ2 and φ3) are input to the transistors (1002 and 1003), (1012 and 1013), (1022 and 1023), and (1032 and 1033), respectively, that are connected in series with these input transistor. Data is taken in when each clock signal is at the high level "H".

In other words, as shown in FIG. 2, the data d0 is taken in when the clock signal φ3 and φ0 are both at the high level "H". The data d1 is taken in when the clock signal φ0 and φ1 are both at the high level "H". The data d2 is taken in when the clock signal φ1 and φ2 are both at the high level "H". The data d3 is taken in when the clock signal φ2 and φ3 are both at the high level "H". Based on this, the parallel data d0 to d3 are converted into serial data in synchronism with the four-phase clock signals (φ0 to φ3), and the serial data are transferred to an output OUT.

Figure 3:
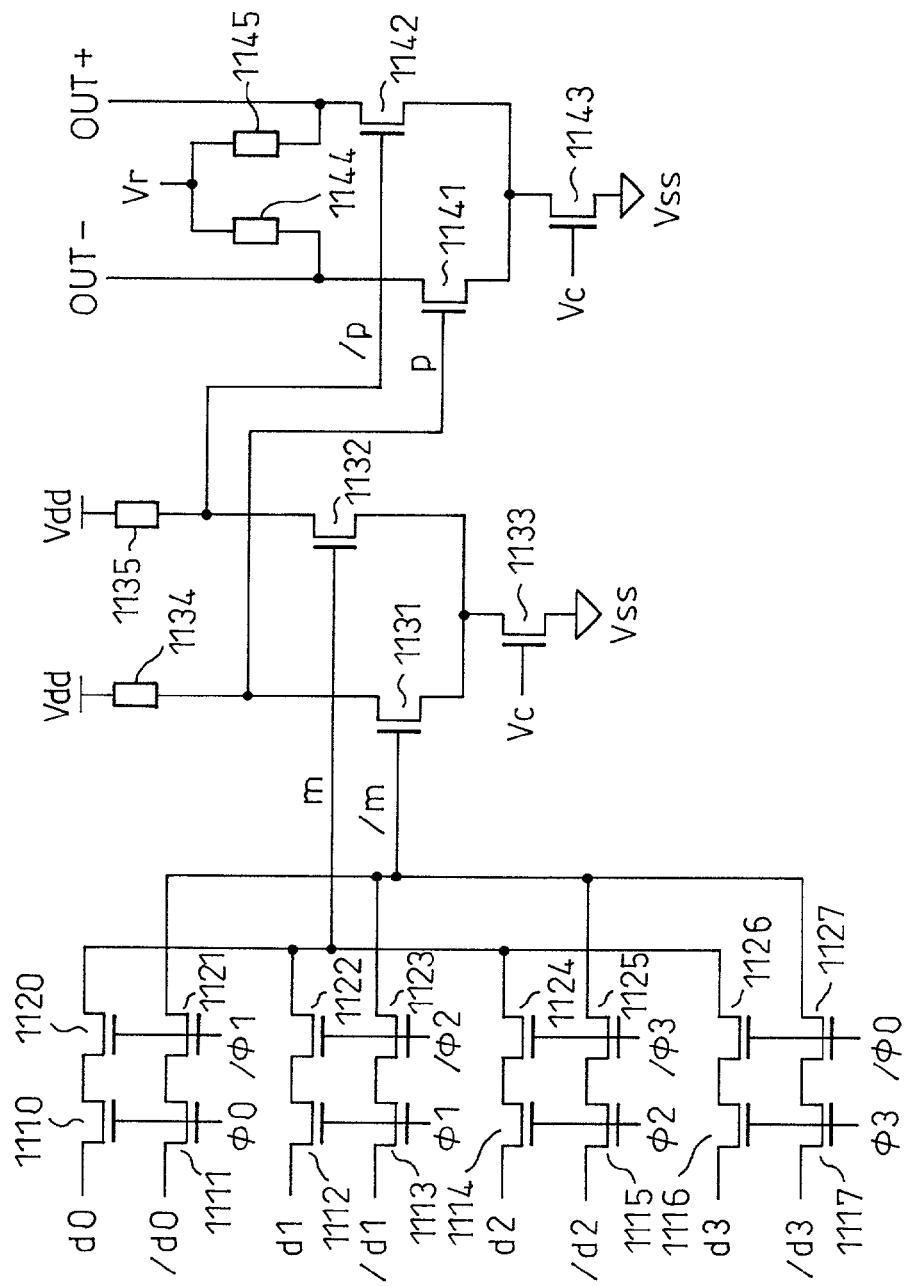
FIG. 3 is a circuit diagram that shows another example of a conventional multiplexer circuit.

FIG. 3 is a circuit diagram that shows another example of a conventional multiplexer circuit. FIG. 3 corresponds to FIGS. 11–25 of the above-described literature. In FIG. 3, reference numbers 1110 to 1117, 1120 to 1127, 1131 to 1133, and 1141 to 1143 denote nMOS transistors. Reference numbers 1134, 1135, 1144 and 1145 denotes loads. Clock signals φ0 to φ3 denote four-phase clock signals that have their phases mutually separated by 90 degrees respectively, and d0 to d3 denote parallel data.

Clock signals /φ0 to /φ3 and data /d0 to /d3 denote inverted signals (signals of an opposite logic) of the clock signals φ0 to φ3 and the data d0 to d3, respectively. Therefore, the clock signal /φ0 is the same as the clock signal φ2, and the clock signal /φ1 is the same as the clock signal φ3, for example. A reference symbol Vc denotes a predetermined bias voltage that is applied to the gates of the transistors 1133 and 1143. Vr denotes a reference voltage that is applied to outputs OUT− and OUT+ via the loads 1144 and 1145 respectively.

The multiplexer circuit shown in FIG. 3 uses differential (complementary) signals. Positive-logic parallel data d0, d1, d2, and d3 are taken in, when each pair of clock signals (φ0 and /φ1), (φ1 and /φ2), (φ2 and /φ3), and (φ3 and /φ0) that are supplied to the gates of corresponding transistors (1110 and 1120), (1112 and 1122), (1114 and 1124), and (1116 and 1126) have become at the high level "H". Each data is supplied to the gate of one transistor 1132 that constitutes a differential pair as serial data m. Similarly, negative-logic parallel data /d0, /d1, /d2, and /d3 are taken in, when each pair of clock signals (φ0 and /φ1), (φ1 and /φ2), (φ2 and /φ3), and (φ3 and /φ0) that are supplied to the gates of corresponding transistors (1111 and 1121), (1113 and 1123), (1115 and 1125), and (1117 and 1127) have become at the high level "H". Each data is supplied to the gate of the other transistor 1131 that constitutes the differential pair as serial data /m.

A differential amplifier that is constructed of the transistors 1131 to 1133 and the loads 1134 and 1135 acts as a pre-driver. Differential outputs p and /p of this pre-driver are supplied to differential inputs (the gates of the differential transistors 1141 and 1142) of an output-stage differential amplifier that is constructed of the transistors 1141 to 1143 and the loads 1144 and 1145. This output-stage differential amplifier outputs differential outputs OUT+ and OUT−.

The conventional multiplexer circuits shown in FIG. 1 to FIG. 3 have the following problems to be solved.

First, according to the conventional multiplexer circuits explained with reference to FIG. 1 and FIG. 2, there is the following problem. As soon as series-connected transistors that are controlled according to clock signals have been disconnected, a node immediately above these transistors is charged based on a current that is determined based on a potential of this node and a potential of data that is input to a transistor immediately above. As a result, the potential of this node increases. In this case, a time constant becomes very large as compared with a time constant according to a charge using a pMOS transistor. Consequently, it becomes difficult to carry out a high-speed operation.

For example, assume that the parallel data d0 is at the high level "H". When the clock signals φ3 and φ0 are both at the high level "H", the transistors 1002 and 1003 are turned ON, and the potential of the output OUT is lowered to the low level "L" (Vss). Thereafter, when the clock signal φ3 has fallen from the high level "H" to the low level "L", the transistor 1002 is turned OFF. At the same time, the clock signal φ1 rises from the low level "L" to the high level "H", thereby to turn ON the transistor 1013. (At this time, the transistor 1011 is ON, as the clock signal φ0 is at the high level "H".) Consequently, a level corresponding to the data d1 appears at the output OUT. When the parallel data d1 is at the low level "L" at this time, the output OUT changes to the high level "H" according to the data d1. In order to raise the output OUT to the high level "H" (Vdd) at high speed, it is necessary to make small the value of the resistance (pull-up resistance) RT. However, the lowering of the pull-up resistance RT brings about an increase in the power consumption. Therefore, in actual practice, it has been difficult to realize a high-speed operation in the circuit shown in FIG. 1.

Next, according to the conventional multiplexer circuits explained with reference to FIG. 3, two transfer gates exist at the node that drives the pre-driver from the parallel data side. Therefore, it has been difficult to realize a high-speed operation in the circuit shown in FIG. 3.

For example, the parallel data d0 and /d0 are supplied to the gates of the differential pair of transistors 1132 and 1131 of the pre-driver, via the transfer gates (transistors) (1110 and 1120) and (1111 and 1121) that are controlled based on the clock signals φ0 and /φ1, respectively. However, because of a delay in the two transfer gates that have been inserted in series, it has been difficult to realize a high-speed operation.

Embodiments of a multiplexer circuit relating to the present invention will be explained in detail below with reference to the accompanying drawings.

Figure 4:
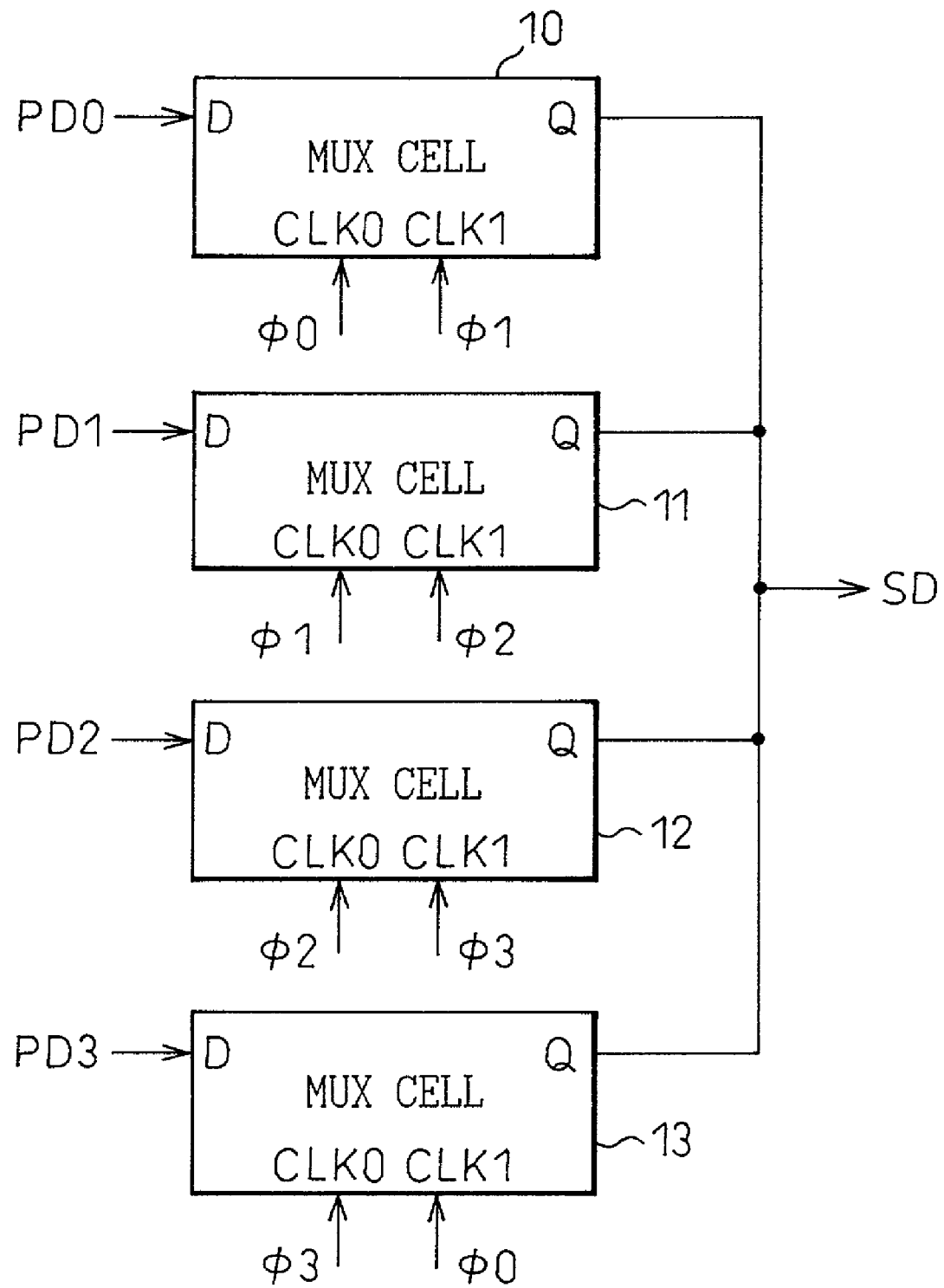
FIG. 4 is a block diagram that shows one example of a total structure of a multiplexer circuit relating to the present invention.
Figure 5:
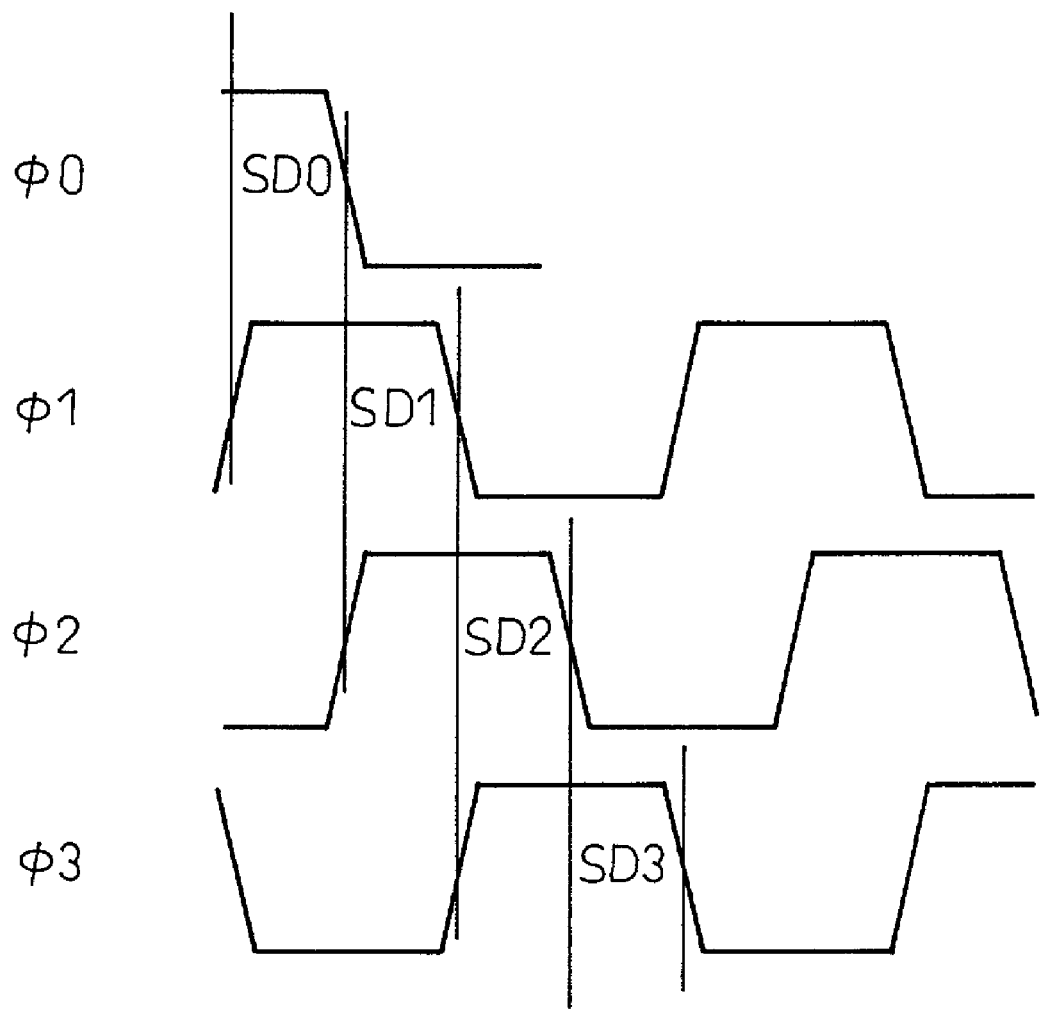
FIG. 5 is a timing diagram for explaining the operation of the multiplexer circuit shown in FIG. 4.

FIG. 4 is a block diagram that shows one example of a total structure of a multiplexer circuit relating to the present invention, and FIG. 5 is a timing diagram for explaining the operation of the multiplexer circuit shown in FIG. 4. In FIG. 4, reference numbers 10 to 13 denote multiplexer cells, PD0 to PD3 denoted parallel data, and SD denotes a serial data. While the multiplexer circuit shown in FIG. 4 is an example of a multiplexer circuit of 4:1, it is needless to mention that the ratio is not limited to this in the present invention.

As shown in FIG. 4, the multiplexer circuit has four multiplexer cells 10 to 13. The multiplexer cells 10, 11, 12 and 13 are supplied with clock signals (φ0 and φ1), (φ1 and φ2), (φ2 and φ3), and (φ3 and φ0) respectively. As shown in FIG. 5, the clock signals φ0 to φ3 are four-phase clock signals, and their phases are mutually deviated by 90 degrees respectively. The parallel data PD0 to PD3 are converted into serial data SD0 to SD3 in synchronism with the four-phase clock signals φ0 to φ3.

Figure 6:
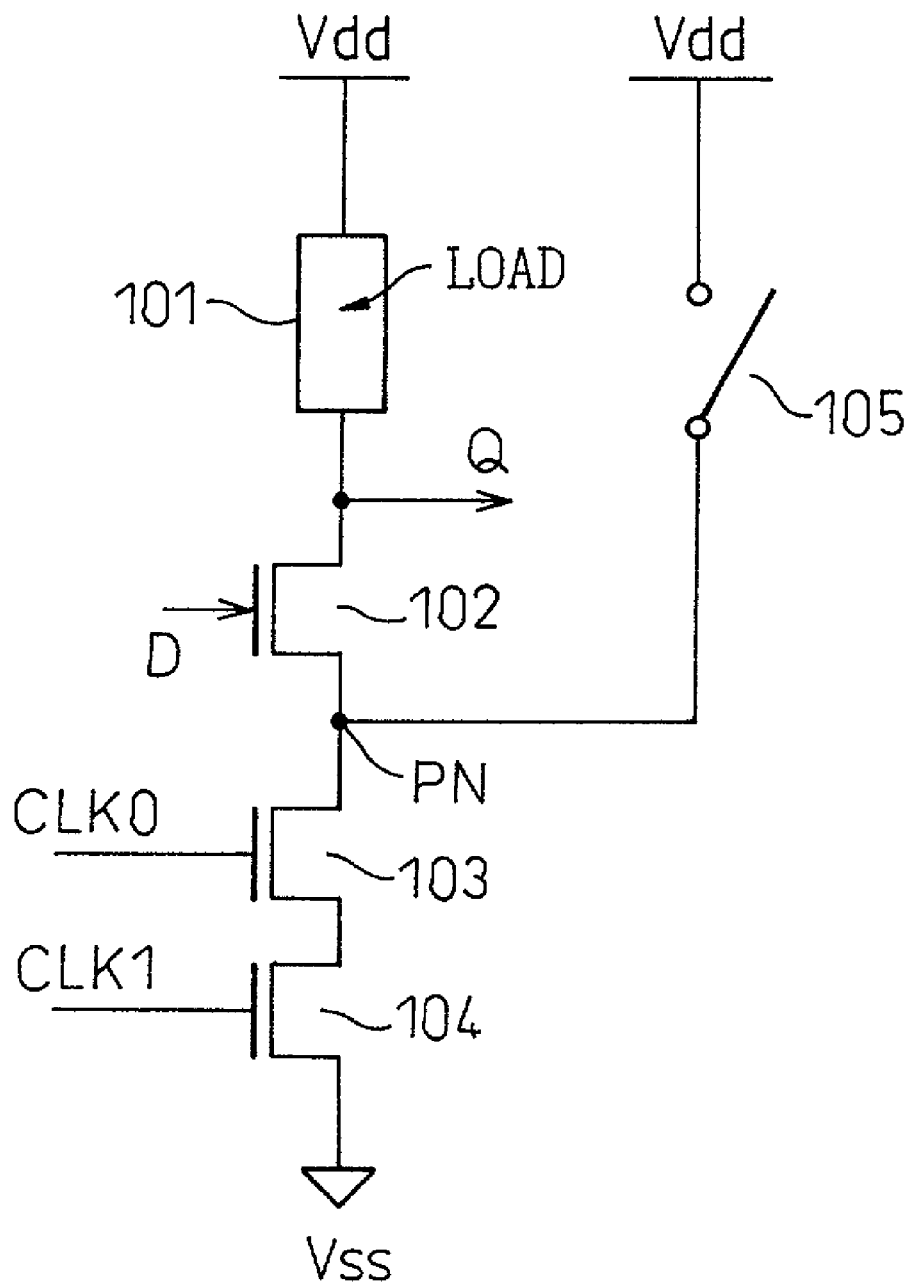
FIG. 6 is a circuit diagram that shows a first embodiment of a multiplexer cell in the multiplexer circuit relating to the present invention.

FIG. 6 is a circuit diagram that shows a first embodiment of a multiplexer cell in the multiplexer circuit relating to the present invention.

As shown in FIG. 6, a multiplexer cell 100 (10 to 13) of the first embodiment is constructed of a load 101, nMOS transistors 102 to 104, and a pull-up switch (pull-up transistor) 105.

The load 101 is provided between a high-potential power source line (Vdd) and an output node (output Q). Transistors 102 to 104 are connected in series between this output Q and a low-potential power source line (Vss).

The transistor 102 receives an input data D (parallel data PD0 to PD3) at its gate, and drives the output Q. The transistors 103 and 104 carry out switching operation according to clock signals CLK0 and CLK1 that are supplied to their gates respectively. A connection node PN of the transistor 102 and the transistor 103 is connected to the high-potential power source line (Vdd).

In other words, the driving transistor 102 determines the output data (Q) according to the input data D, when the transistors 103 and 104 for switching (for data confirmation) that are controlled based on the clock signals CLK0 and CLK1 respectively are turned ON. The input data D are the parallel data PD0 to PD3 for the multiplexer cells 10 to 13 respectively. Further, the clock signals CLK0 to CLK1 are (φ0 and φ1), (φ1 and φ2), (φ2 and φ3), and (φ3 and φ0) for the multiplexer cells 10 to 13 respectively.

As shown in FIG. 6, according to the multiplexer cell 100 of the first embodiment, the pull-up switch 105 that pulls up a voltage to the high-potential power source voltage Vdd is connected to the connection node PN of the driving transistor 102 and the data confirmation transistor 103. The pull-up switch 105 directly pulls up the node of the transistor 102 to which a data is input. Therefore, this structure is superior to that of the conventional example shown in FIG. 1 in the aspect of high-speed operation. Further, as the parallel input data D directly drive the gate of the nMOS transistor 102, it is possible to realize a high-speed operation, unlike the multiplexer circuit of the conventional example shown in FIG. 3.

Figure 7:
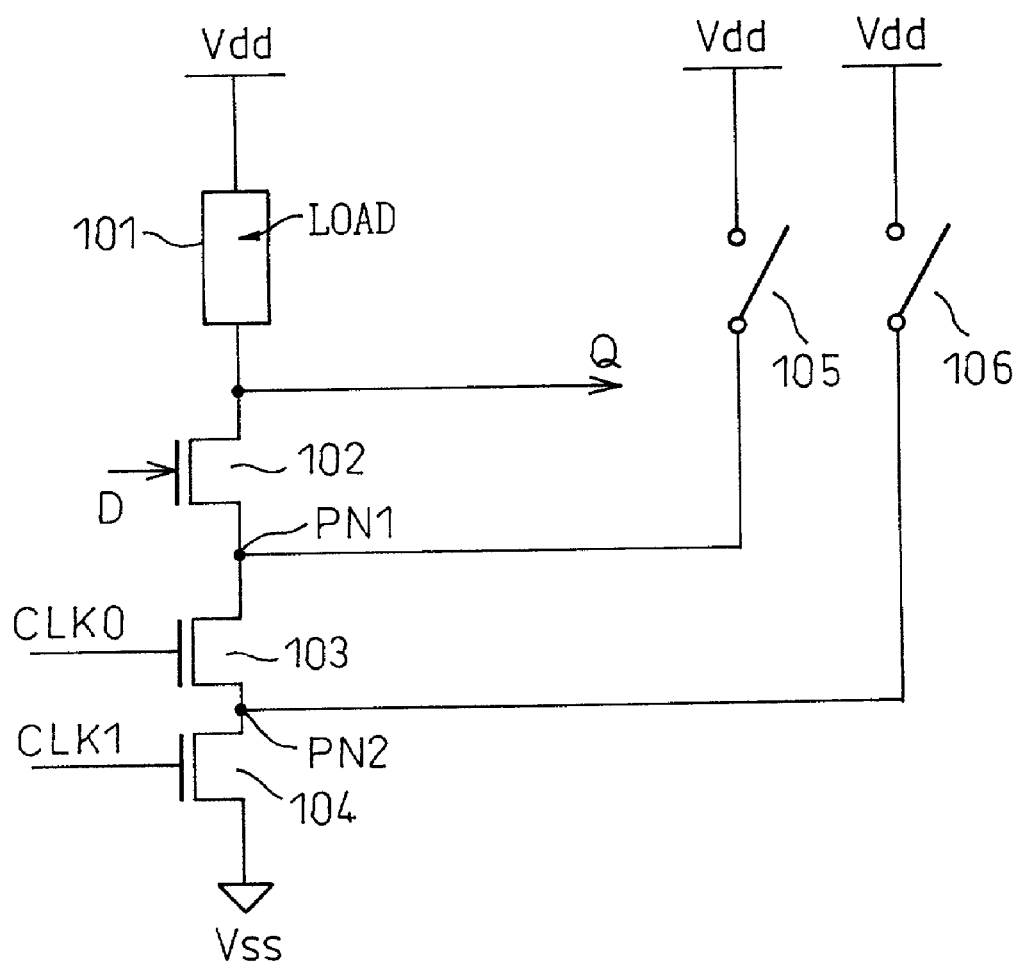
FIG. 7 is a circuit diagram that shows a second embodiment of a multiplexer cell relating to the present invention.

FIG. 7 is a circuit diagram that shows a second embodiment of a multiplexer cell relating to the present invention.

As is clear from the comparison between FIG. 7 and FIG. 6, while the multiplexer cell of the first embodiment has one pull-up position, the multiplexer cell of the second embodiment has two pull-up positions. In other words, a first pull-up switch 105 that pulls up a voltage to a high-potential power source voltage Vdd is provided for a connection node PN1 of a driving transistor 102 and a data confirmation transistor 103. Further, a second pull-up switch 106 that pulls up a voltage to a high-potential power source voltage Vdd is provided for a connection node PN2 of the data confirmation transistor 103 and a data confirmation transistor 104.

As explained above, based on the provision of pull-up positions at a plurality of locations, it becomes possible to shorten a transition time of each node (PN1 and PN2) to an initial status. As a result, it becomes possible to realize a higher-speed operation.

Figure 8:
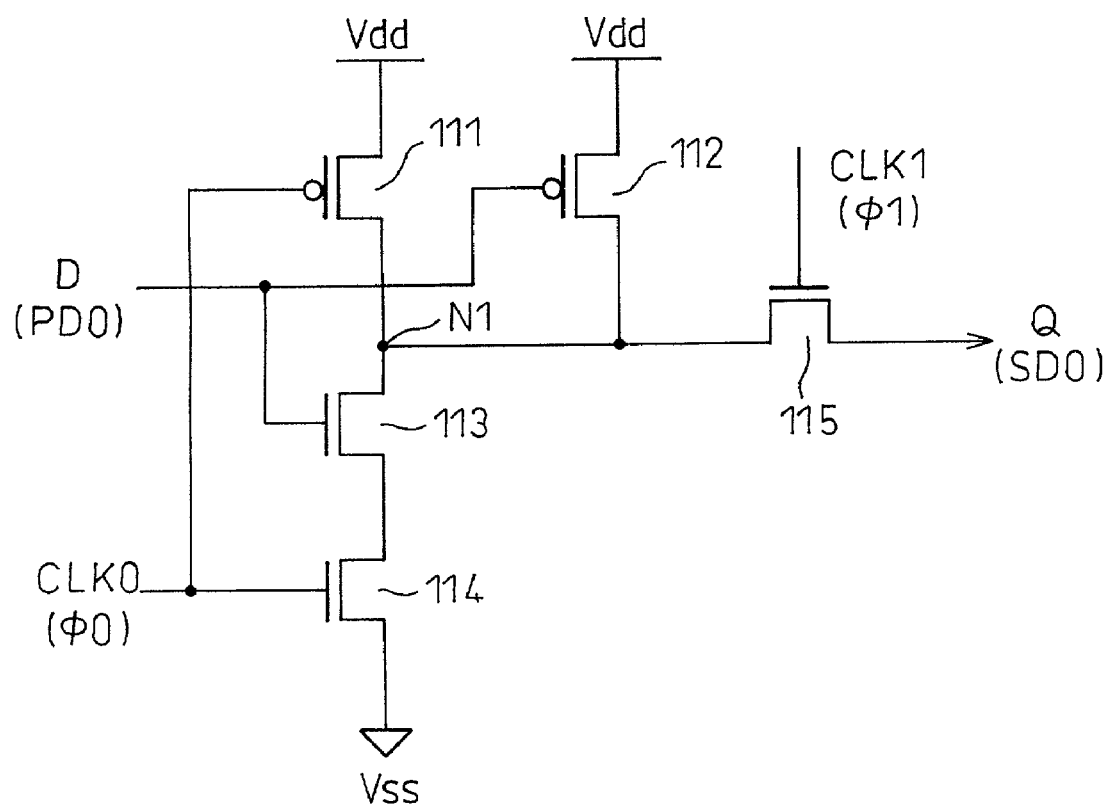
FIG. 8 is a circuit diagram that shows a third embodiment of a multiplexer cell relating to the present invention.
Figure 9:
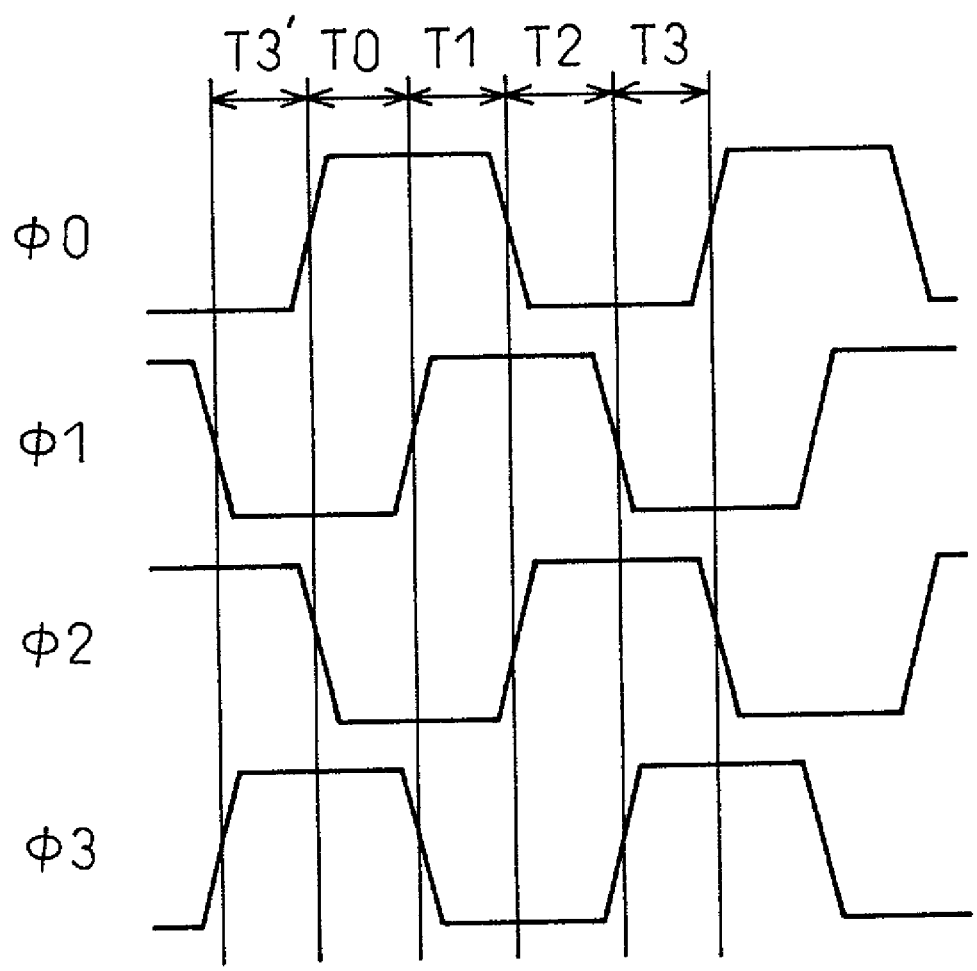
FIG. 9 is a timing diagram for explaining the operation of the multiplexer circuit shown in FIG. 8.

FIG. 8 is a circuit diagram that shows a third embodiment of a multiplexer cell relating to the present invention, and FIG. 9 is a timing diagram for explaining the operation of the multiplexer circuit shown in FIG. 8.

As shown in FIG. 8, the multiplexer cell of the third embodiment is constructed of pMOS transistors 111 and 112, and nMOS transistors 113 to 115. The transistors 111, 113 and 114 are connected in series between a high-potential power source line (Vdd) and a low-potential power source line (Vss). A clock signal CLK0 is supplied to the gates of the transistors 111 and 114. An input data D is supplied to the gate of the driving transistor 113. The pull-up transistor 112 has its source connected to the high-potential power source line (Vdd), and is supplied with the input data D at its gate. The drain of this pull-up transistor 112 is connected to a connection node of the transistors 111 and 113. The transistor 115 that is supplied with a clock signal CLK1 at its gate is inserted between an output Q and the connection node of the transistors 111 and 113.

The application of the multiplexer cell of the third embodiment to the multiplexer cell 10 shown in FIG. 4 will be explained, as an example.

As shown in FIG. 9, when the clock signals φ0 (CLK1) and φ1 (CLK1) are both at the low level "L" (a period T3'), the transistor 111 is ON, and the transistors 114 and 115 are OFF. Further, the node N1 is pulled up to the high level "H" (the high-potential power source voltage Vdd). However, as the transistor 115 is OFF, the level of the node N1 is not transmitted to the output SD0 (Q).

If the parallel data PD0 (D) is at the high level "H", the transistor 113 is turned ON, the transistor 112 is turned OFF, and the clock signal φ0 (CLK1) changes from the low level "L" to the high level "H" (a period T0), based on the data PD0 at the high level "H". Then, the transistor 114 is turned ON, the transistor 111 is turned OFF, and the node N1 is lowered to the low level "L" (the low-potential power source voltage Vss). Next, when the clock signal φ1 also changes from the low level "L" to the high level "H" (a period T1), the transistor 115 is turned ON, and the level of the node N1 becomes the output SD0.

On the other hand, if the parallel data PD0 (D) is at the low level "L", the transistor 113 is turned OFF, the transistor 112 is turned ON, the node N1 is increased to the high level "H" (maintains the high-potential power source voltage Vdd), and the clock signal φ0 changes from the low level "L" to the high level "H" (the period T0), based on the data PD0 at the low level "L". Then, the transistor 114 is turned ON, and the transistor 111 is turned OFF. However, the node N1 maintains the high level "H". Next, when the clock signal φ1 also changes from the low level "L" to the high level "H" (the period T1), the transistor 115 is turned ON, and the level of the node N1 becomes the output SD0.

Further, when the clock signal φ0 changes from the high level "H" to the low level "L" (a period T2), the transistor 114 is turned OFF, the transistor 111 is turned ON, and the node N1 is pulled up to the high level "H" again. During this period T2, the clock signal φ1 is at the high level "H", the transistor 115 is ON, and the level of the node N1 that has been pulled up to the high level "H" is transmitted to the output Q (SD1). However, when the multiplexer cell that operates next outputs the low level "L" (for example, when the parallel data PD1 at the high level "H" is supplied to the multiplexer cell 11 shown in FIG. 4, and the low level "L" is transmitted to the output Q), the level of the output Q (SD1) that has been pulled up to the high level "H" is lowered to the low level "L". The pMOS transistors 111 and 112 are structured as small-sized transistors. When the multiplexer cell that operates next outputs the low level "L" in a status that the transistors 111 an d112 are in the ON status, for example, it is possible to instantaneously lower the level of the output node (Q) to the low level "L".

As explained above, according to the third embodiment, a NAND-type transistor carries out a selection based on the clock signal CLK0 (φ0), unlike the structure of the multiplexer circuit that has been explained with reference to FIG. 3. With this arrangement, it becomes possible to decrease the number of nMOS transistors by one stage (by omitting the transistors 1110 and 1111 shown in FIG. 3, for example), by using only one transistor 115 that is connected to the pull-up bus of the output node. As a result, it becomes possible to realize a high-speed operation.

Figure 10:
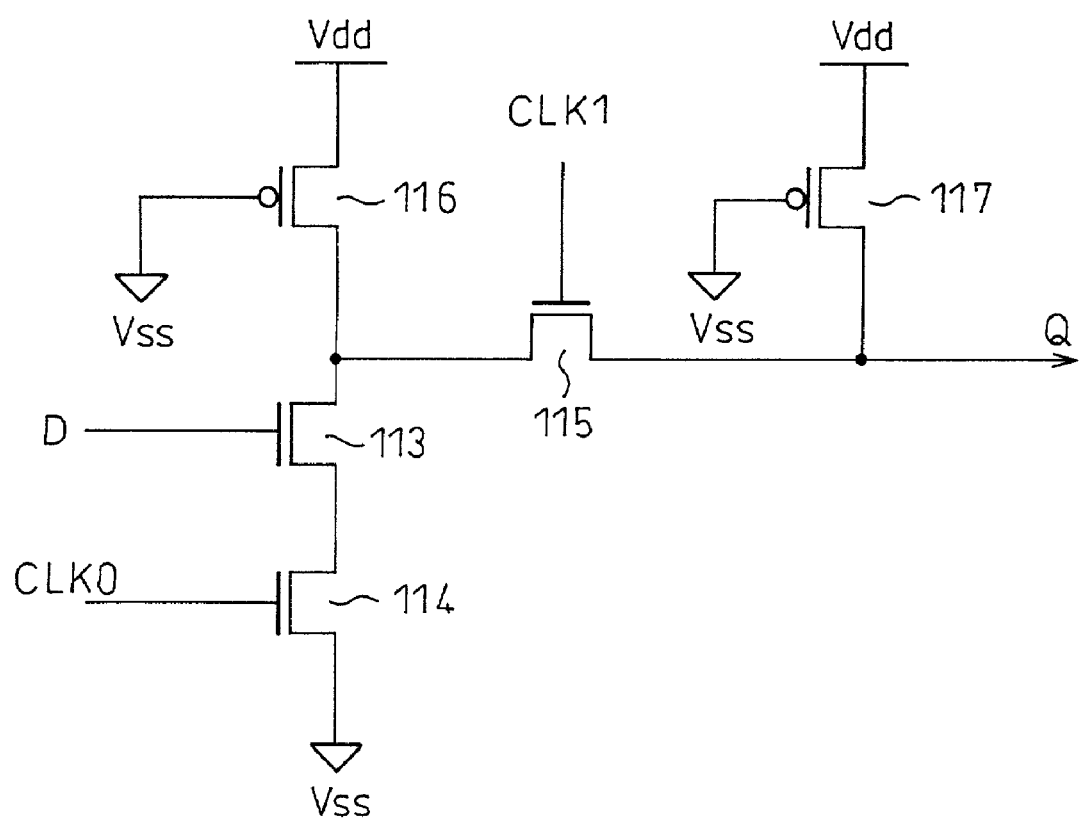
FIG. 10 is a circuit diagram that shows a fourth embodiment of a multiplexer cell relating to the present invention.

FIG. 10 is a circuit diagram that shows a fourth embodiment of a multiplexer cell relating to the present invention.

As shown in FIG. 10, the multiplexer cell of the fourth embodiment is constructed of pMOS transistors 116 and 117, and nMOS transistors 113 to 115. The nMOS transistors 113 to 115 have a similar function to that of the nMOS transistors 113 to 115 in the third embodiment. The pMOS transistor 116 that is applied with a low-potential power source voltage Vss at its gate functions as a load element. The pMOS transistor 117 that is applied with a low-potential power source voltage Vss at its gate functions as a pull-up element.

As explained above, according to the fourth embodiment, the transistor 114 that carries out a selection based on the clock signal CLK0 is disposed at the low-potential source line (Vss) side of the data input transistor 113. This is different from the structure of the multiplexer circuit explained with reference to FIG. 3. With this arrangement, it becomes possible to decrease the number of nMOS transistors by one stage (by omitting the transistors 1110 and 1111 shown in FIG. 3, for example), by using only one transistor 115 that is connected to the pull-up bus of the output node. As a result, it becomes possible to realize a high-speed operation.

Figure 11:
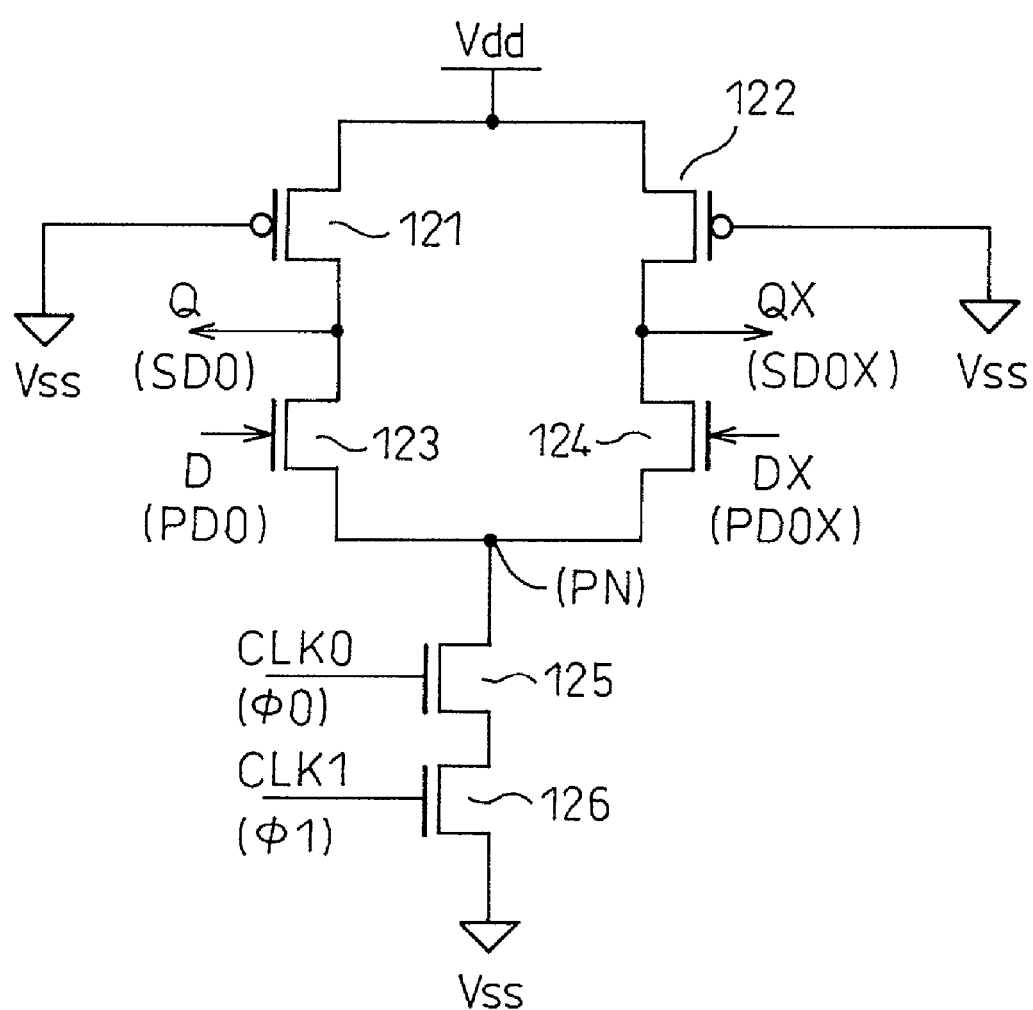
FIG. 11 is a circuit diagram that shows a fifth embodiment of a multiplexer cell relating to the present invention.

FIG. 11 is a circuit diagram that shows a fifth embodiment of a multiplexer cell relating to the present invention. This multiplexer cell handles differential signals.

As shown in FIG. 11, the multiplexer cell of the fifth embodiment is constructed of pMOS transistors 121 and 122, and nMOS transistors 123 to 126. The pMOS transistors 121 and 122 that are applied with a low-potential power source voltage Vss at their gates function as load elements. The nMOS transistors 123 and 124 are a differential pair of transistors. Differential (complementary) input data D and DX (parallel data PD and XPD) are supplied to the gates of these transistors 123 and 124. The input data DX and the parallel data PDX show signals of the input data D and the parallel data PD of an inverted level respectively.

The transistors 125 and 126 are provided between a differential amplifier section (the transistors 121 to 124) and a low-potential power source line (Vss). A clock CLK0 is supplied to the gate of the transistor 125, and a clock CLK1 is supplied to the gate of the transistor 126. The fifth embodiment corresponds to a structure of the first embodiment shown in FIG. 6 in which the load 101 is constructed of the transistor 121 (122), and the pull-up switch 105 is constructed of the transistors 122 and 124 (121 and 123).

The application of the multiplexer cell of the fifth embodiment to the multiplexer cell 10 shown in FIG. 4 will be explained, as an example. When the clock signals φ0 (CLK1) and φ1 (CLK1) are both at the high level "H" (a period T1 in FIG. 9), the differential amplifier section is activated (the differential pair of transistors 123 and 124 that receive the parallel data PD0 and PD0X operate). Consequently, output levels Q and QX (SD0 and SD0X) become firm. When the input data D (the parallel data PD) that is supplied to the gate of the transistor 123 is at the low level "L", the output (the serial data) SD0 becomes at the high level "H". At this time, the input data DX (the parallel data PDX) becomes at the high level "H", and the transistor 124 is turned ON to pull up a node (PN) immediately below the differential pair of transistors 123 and 124.

As explained above, according to the fifth embodiment, it is possible to realize a high-speed operation, by deleting the nMOS transistors (the transistors 1110, 1120, 1111, and 1121 in FIG. 3, for example) that are connected to the pull-up path of the output node. Further, according to the fifth embodiment, it is possible to realize a high-speed operation, by complementarily pulling up the node (PN) immediately below the nMOS transistor 123 that is supplied with an input data, with the transistors 122, 124, 121 and 123.

Figure 12:
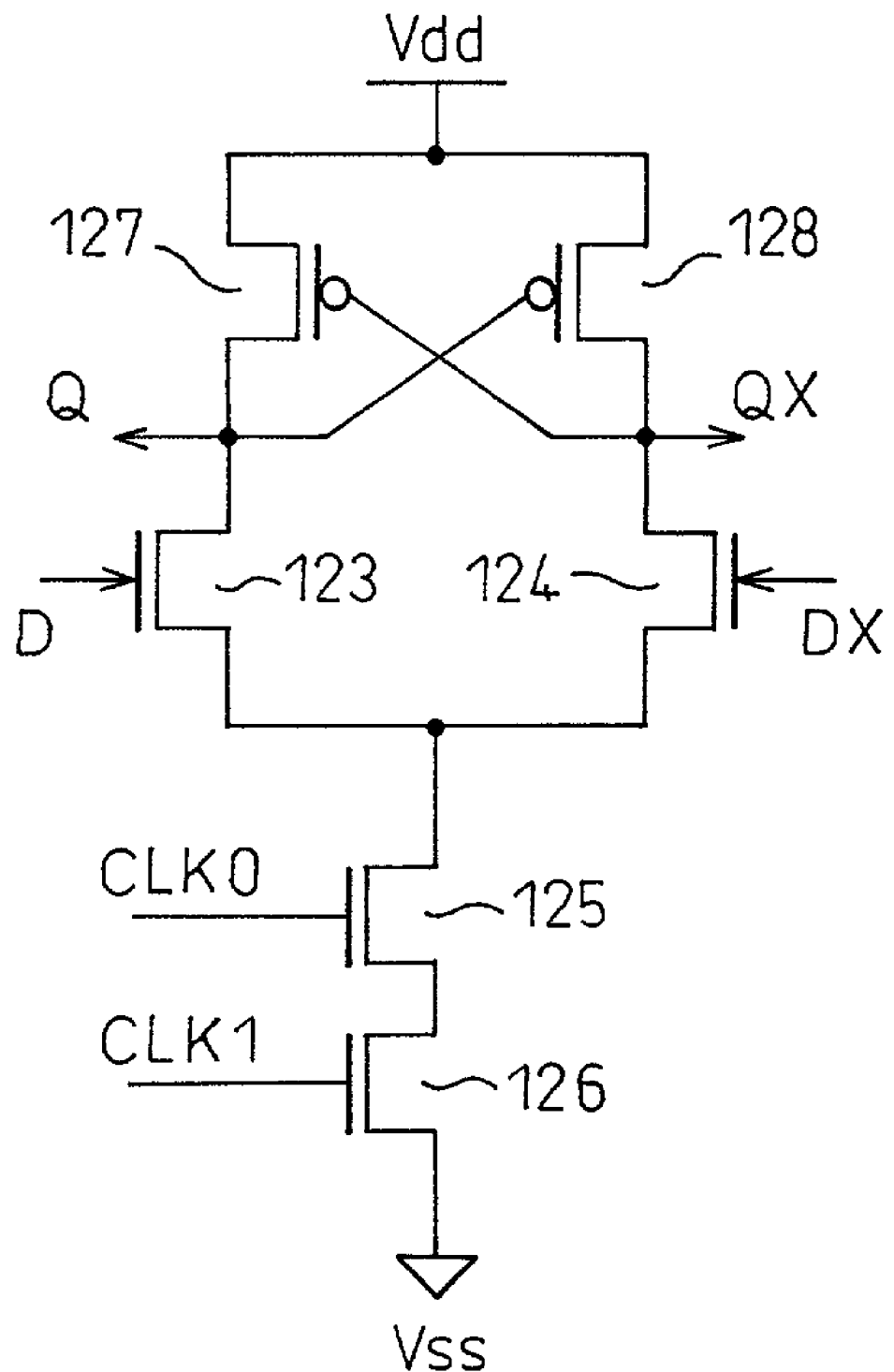
FIG. 12 is a circuit diagram that shows a sixth embodiment of a multiplexer cell relating to the present invention.

FIG. 12 is a circuit diagram that shows a sixth embodiment of a multiplexer cell relating to the present invention.

As is clear from the comparison between FIG. 12 and FIG. 11, according to the multiplexer cell of the sixth embodiment, the load elements (the transistors 121 and 122) are structured with pMOS transistors 127 and 128 that are connected by cross coupling, in the multiplexer cell of the fifth embodiment. Based on this structure, it is possible to realize a high-speed operation while keeping a complementary relationship, by complementarily pulling up output nodes (Q and QX) that are driven by a differential pair of transistors 123 and 124.

Figure 13:
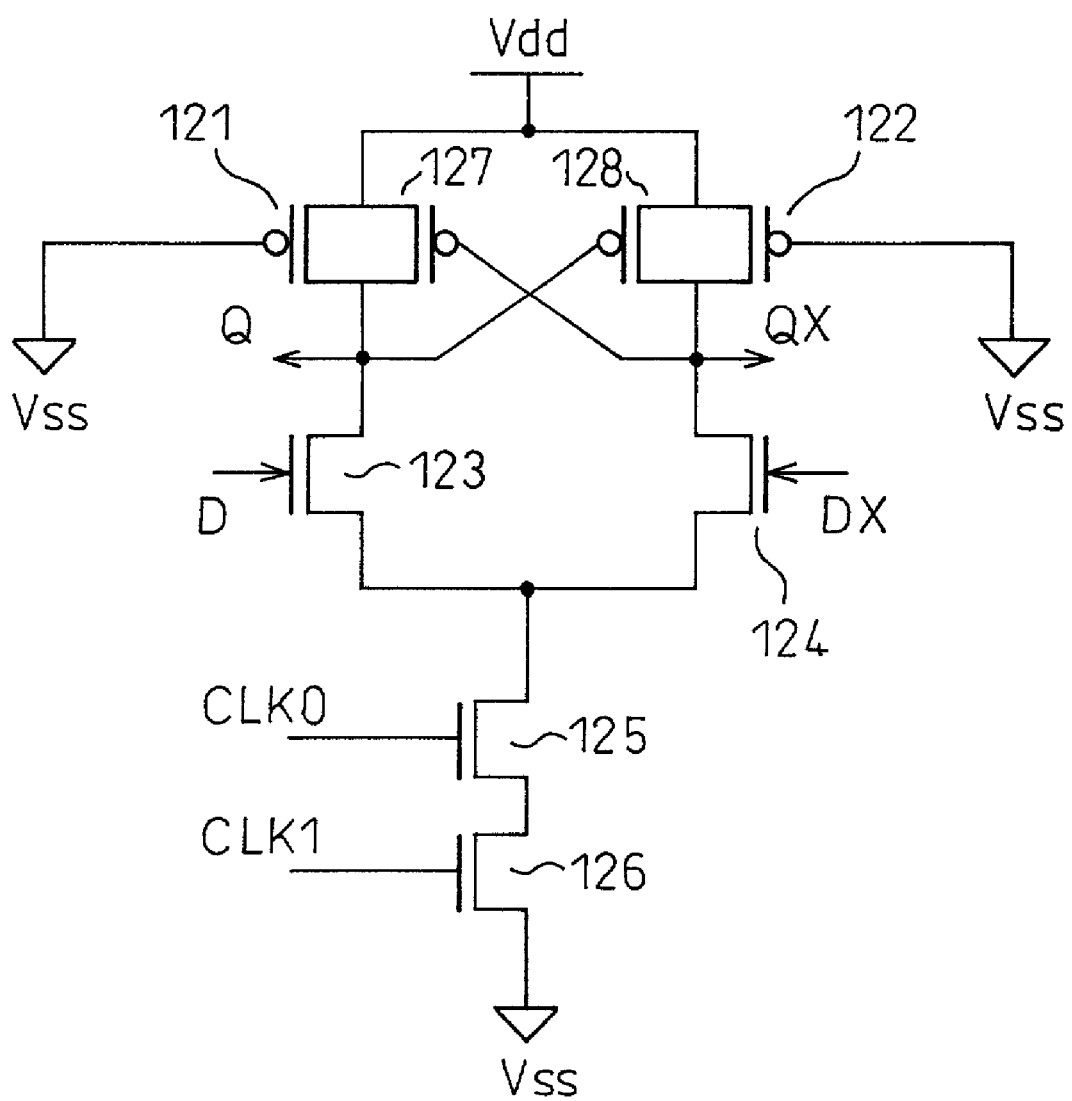
FIG. 13 is a circuit diagram that shows a seventh embodiment of a multiplexer cell relating to the present invention.

FIG. 13 is a circuit diagram that shows a seventh embodiment of a multiplexer cell relating to the present invention.

The multiplexer cell of the seventh embodiment includes both the transistors 121 and 122, and the transistors 127 and 128 of the fifth embodiment shown in FIG. 11 and the sixth embodiment shown in FIG. 12.

The multiplexer cell of the sixth embodiment shown in FIG. 12 can compensate for differential (complementary) signals, even when there is a variation in the manufacturing of transistors, for example. However, the operation speed is lower, at this portion, than the operation speed of the multiplexer cell according to the fifth embodiment shown in FIG. 11.

The multiplexer cell of the seventh embodiment has the advantages of both the fifth embodiment and the sixth embodiment. The pMOS loads 121 and 122 pull up the output nodes (Q and QX) that are driven by the pair of differential transistors 123 and 124. At the same time, the cross-coupled loads 127 and 128 complementarily pull up these output nodes (Q and QX). With this arrangement, it is possible to reduce the drain load to less than that of the sixth embodiment, while keeping a complementary relationship. In other words, as the gates of the transistors 125 and 126, that are connected by cross coupling, are connected to the drains of the two transistors 122 and 126, and 121 and 125, that are connected in parallel respectively, it is possible to reduce the drain load. This contributes to the highspeed operation.

Figure 14:
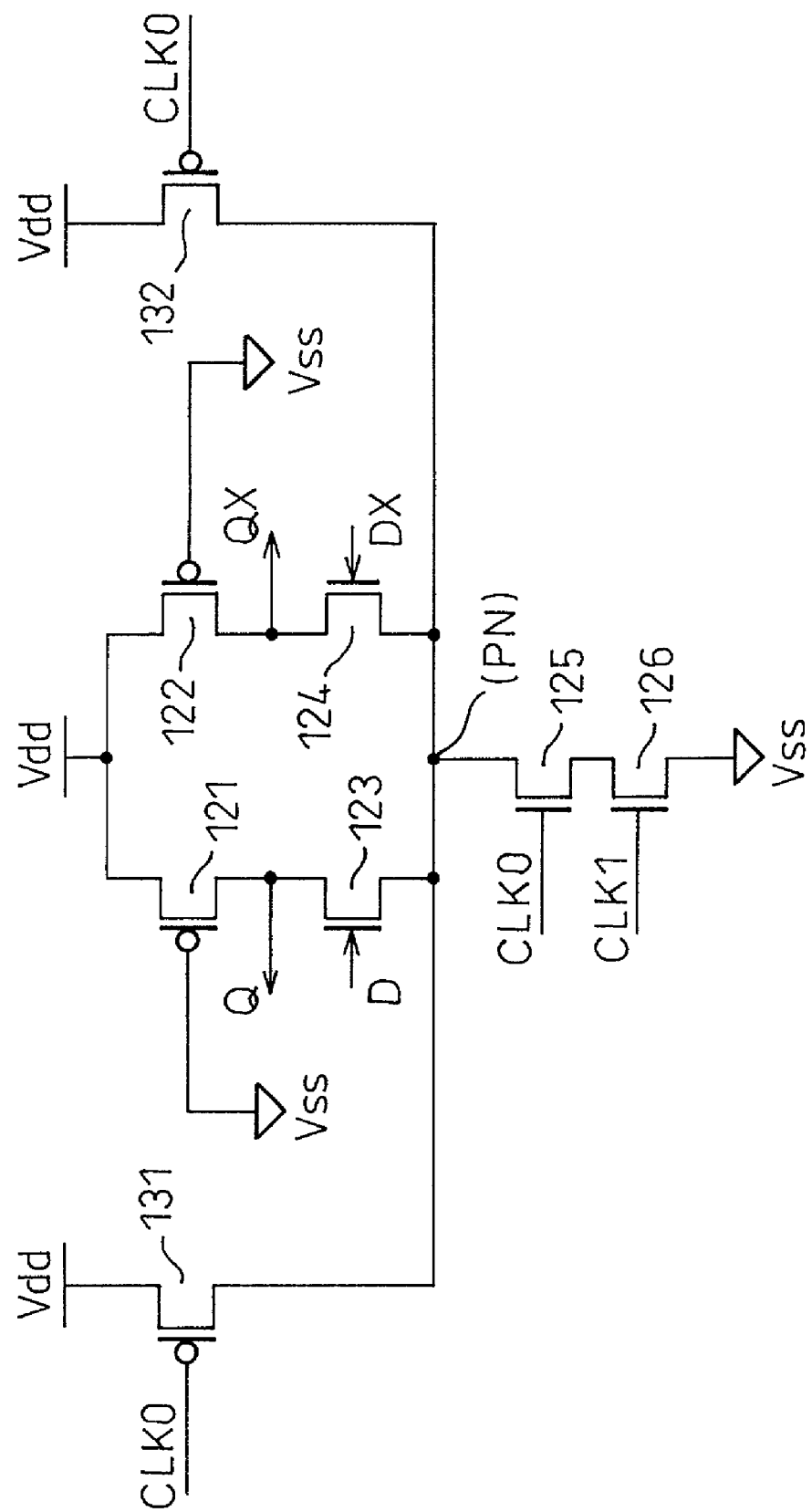
FIG. 14 is a circuit diagram that shows an eighth embodiment of a multiplexer cell relating to the present invention.

FIG. 14 is a circuit diagram that shows an eighth embodiment of a multiplexer cell relating to the present invention.

As is clear from the comparison between FIG. 14 and FIG. 11, the multiplexer cell of the eighth embodiment has pMOS transistors 131 and 132 that pull up a node (PN) immediately below the differential pair of transistors 123 and 124, in the multiplexer cell of the fifth embodiment.

A clock signal CLK0 that is supplied to the gate of an nMOS transistor 125 is supplied to the gates of the transistors 131 and 132 respectively. During a period while the clock signal CLK0 is at the low level "L", and the transistor 125 is OFF, the transistors 131 and 132 are ON to pull up the node PN. The two pull-up transistors 131 and 132 are provided, in this case, in order to maintain symmetry of the circuit on the layout. Therefore, when it is possible to dispose a pull-up transistor at a center portion of a differential amplifier section (the transistors 121 to 124) on the layout, this pull-up transistor can be constituted by one transistor.

According to the multiplexer cell of the eighth embodiment, the transistors 131 and 132 are ON to pull up the node PN, during a period while the transistor 125 is OFF. With this arrangement, it becomes possible to shorten a transition time of the node PN to an initial status. As a result, it becomes possible to realize a high-speed operation.

Figure 15:
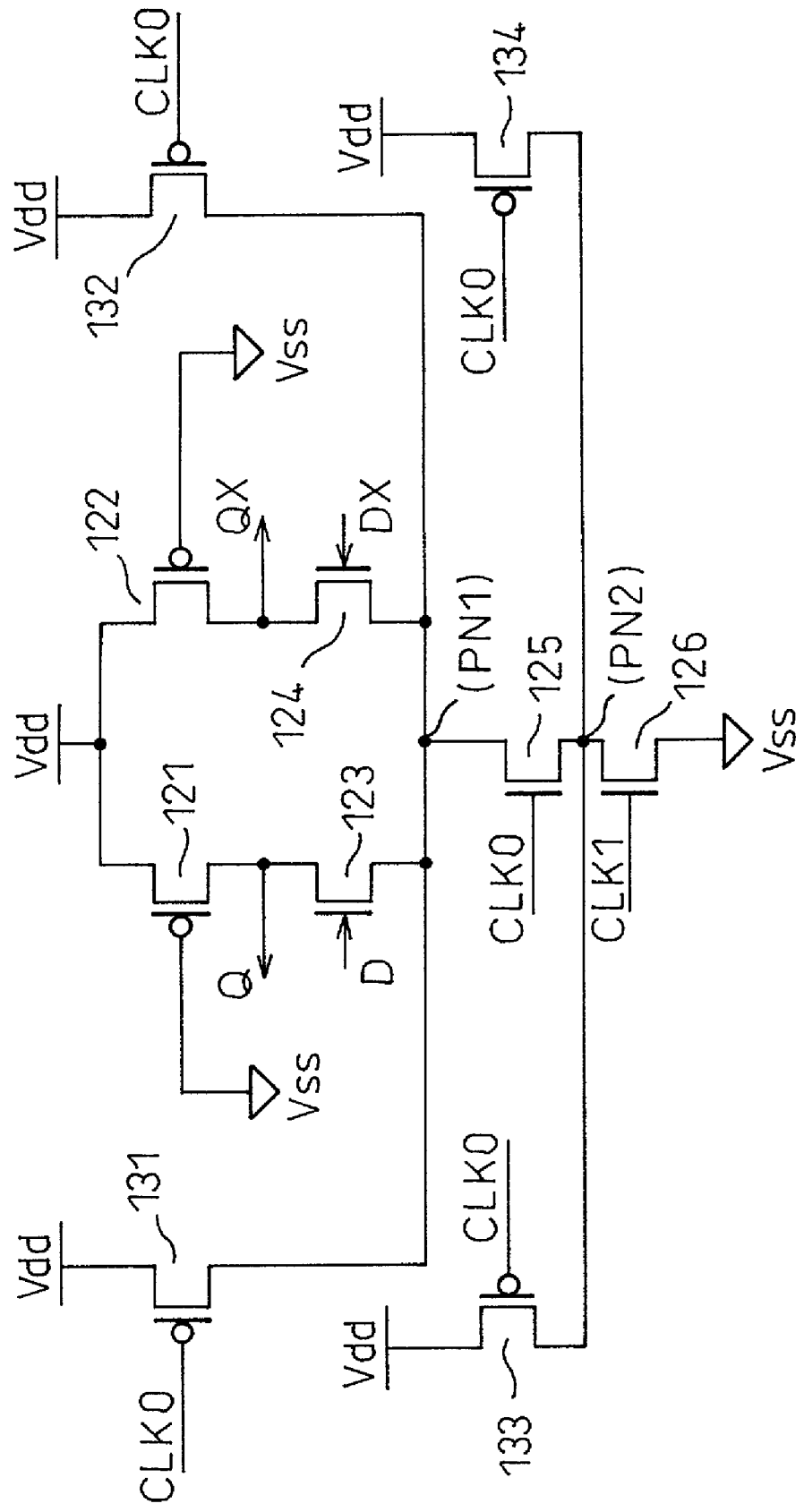
FIG. 15 is a circuit diagram that shows a ninth embodiment of a multiplexer cell relating to the present invention.

FIG. 15 is a circuit diagram that shows a ninth embodiment of a multiplexer cell relating to the present invention.

As is clear from the comparison between FIG. 15 and FIG. 14, the multiplexer cell of the ninth embodiment has further pMOS transistors 133 and 134 that pull up a connection node (PN2) of the transistors 125 and 126, in the multiplexer cell of the eighth embodiment. In the ninth embodiment, pMOS transistors 131 and 132 pull up a node (PN1) immediately below differential pair of transistors 123 and 124, in a similar manner to that of the eighth embodiment. A clock signal CLK0 that is the same as that supplied to the gate of the transistor 125 is supplied to the gates of these transistors 131 to 134 respectively.

According to the multiplexer cell of the ninth embodiment, there are two pull-up positions (a plurality of positions) in a similar manner to that of the multiplexer cell of the second embodiment shown in FIG. 7. Therefore, it becomes possible to shorten a transition time of each node (PN1 and PN2) to an initial status. As a result, it becomes possible to realize a higher-speed operation.

Figure 16:
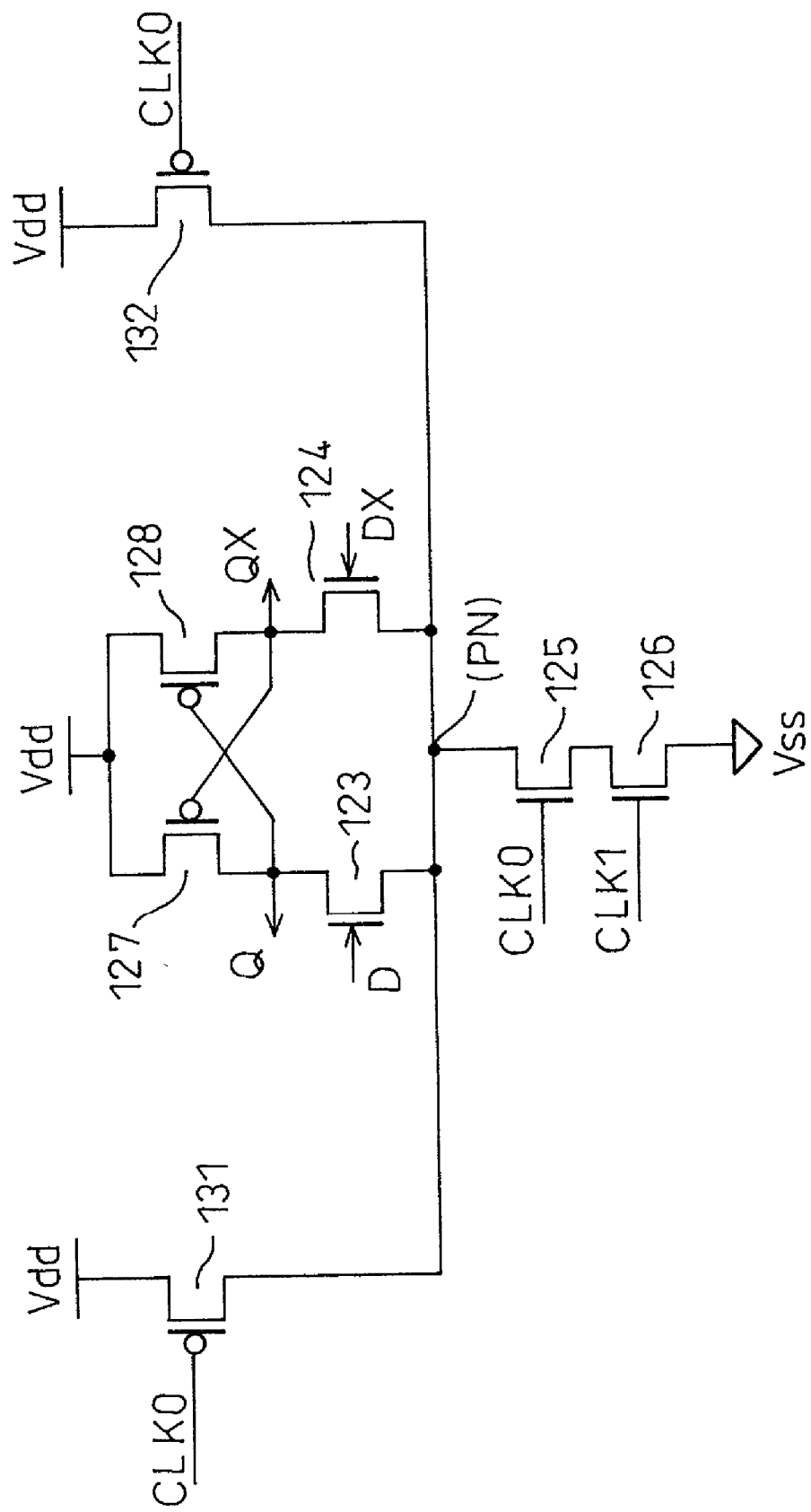
FIG. 16 is a circuit diagram that shows a tenth embodiment of a multiplexer cell relating to the present invention.

FIG. 16 is a circuit diagram that shows a tenth embodiment of a multiplexer cell relating to the present invention.

As is clear from a comparison between FIG. 16 and FIG. 14, according to the multiplexer cell of the tenth embodiment, the load elements (the pMOS transistors 121 and 122) of the differential amplifier section are structured with pMOS transistors 127 and 128 that are connected by cross coupling, in the multiplexer cell of the eighth embodiment. Based on this structure, it is possible to realize a high-speed operation while keeping a complementary relationship, by complementarily pulling up output nodes (Q and QX) that are driven by a differential pair of transistors 123 and 124. The transistors 131 and 132 are ON to pull up the node PN, during a period while the transistor 125 is OFF. With this arrangement, it becomes possible to shorten a transition time of the node PN to an initial status. As a result, it becomes possible to realize a high-speed operation, in a similar manner to that of the eighth embodiment.

Figure 17:
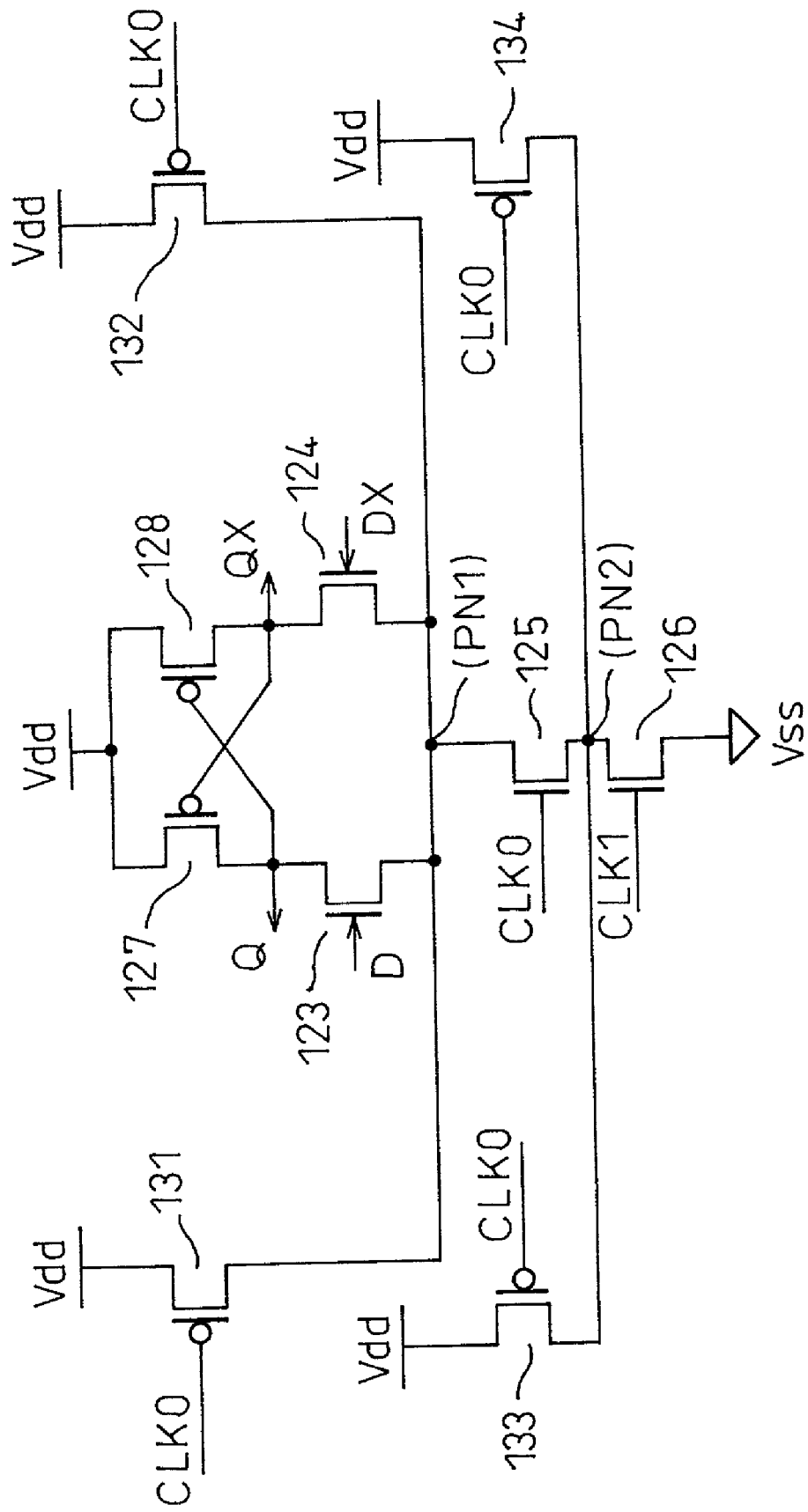
FIG. 17 is a circuit diagram that shows an eleventh embodiment of a multiplexer cell relating to the present invention.

FIG. 17 is a circuit diagram that shows an eleventh embodiment of a multiplexer cell relating to the present invention.

The multiplexer cell of the eleventh embodiment is further provided with pMOS transistors 133 and 134 that pull up a connection node (PN2) of the transistors 125 and 126, in the multiplexer cell of the tenth embodiment shown in FIG. 16. This is similar to the eighth embodiment shown in FIG. 14 and the ninth embodiment shown in FIG. 15. pMOS transistors 131 and 132 pull up a node (PN1) immediately below differential pair of transistors 123 and 124, in a similar manner to that of the tenth embodiment. A clock signal CLK0 that is the same as that supplied to the gate of the transistor 125 is supplied to the gates of these transistors 131 to 134 respectively.

According to the multiplexer cell of the eleventh embodiment, there are two pull-up positions (a plurality of positions) as in the multiplexer cell of the second embodiment shown in FIG. 7 and the ninth embodiment shown in FIG. 15. Therefore, it becomes possible to shorten a transition time of each node (PN1 and PN2) to an initial status. As a result, it becomes possible to realize a higher-speed operation.

Figure 18:
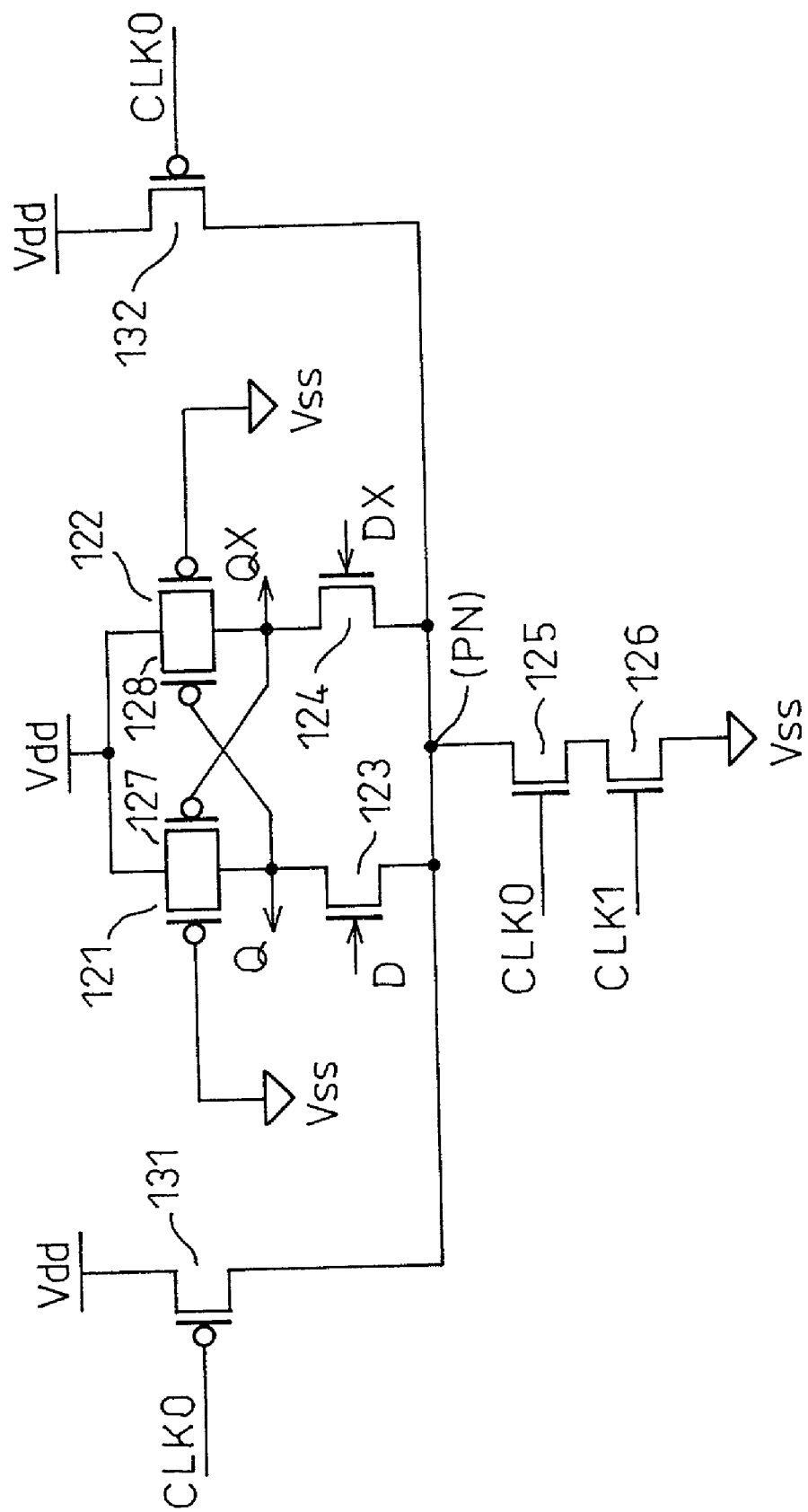
FIG. 18 is a circuit diagram that shows a twelfth embodiment of a multiplexer cell relating to the present invention.

FIG. 18 is a circuit diagram that shows a twelfth embodiment of a multiplexer cell relating to the present invention.

The multiplexer cell of the twelfth embodiment includes both the transistors 121 and 122, and the transistors 127 and 128 of the eighth embodiment shown in FIG. 14 and the tenth embodiment shown in FIG. 16. A differential amplifier section in the multiplexer cell of the eleventh embodiment is similar to that of the seventh embodiment explained with reference to FIG. 13.

The pMOS loads 121 and 122 pull up the output nodes (Q and QX) that are driven by the pair of differential transistors 123 and 124. At the same time, the cross-coupled loads 127 and 128 complementarily pull up these output nodes (Q and QX). With this arrangement, it is possible to reduce the drain load more than that of the sixth embodiment, while keeping a complementary relationship.

In other words, as the gates of the transistors 125 and 126 that are connected by cross coupling are connected to the drains of the two transistors 122 and 126, and 121 and 125, that are connected in parallel respectively, it is possible to reduce the drain load. This contributes to the high-speed operation. The transistors 131 and 132 are ON to pull up the node PN, during a period while the transistor 125 is OFF. With this arrangement, it becomes possible to shorten a transition time of the node PN to an initial status. As a result, it becomes possible to realize a high-speed operation, in a similar manner to that of the eighth embodiment and the tenth embodiment respectively.

Figure 19:
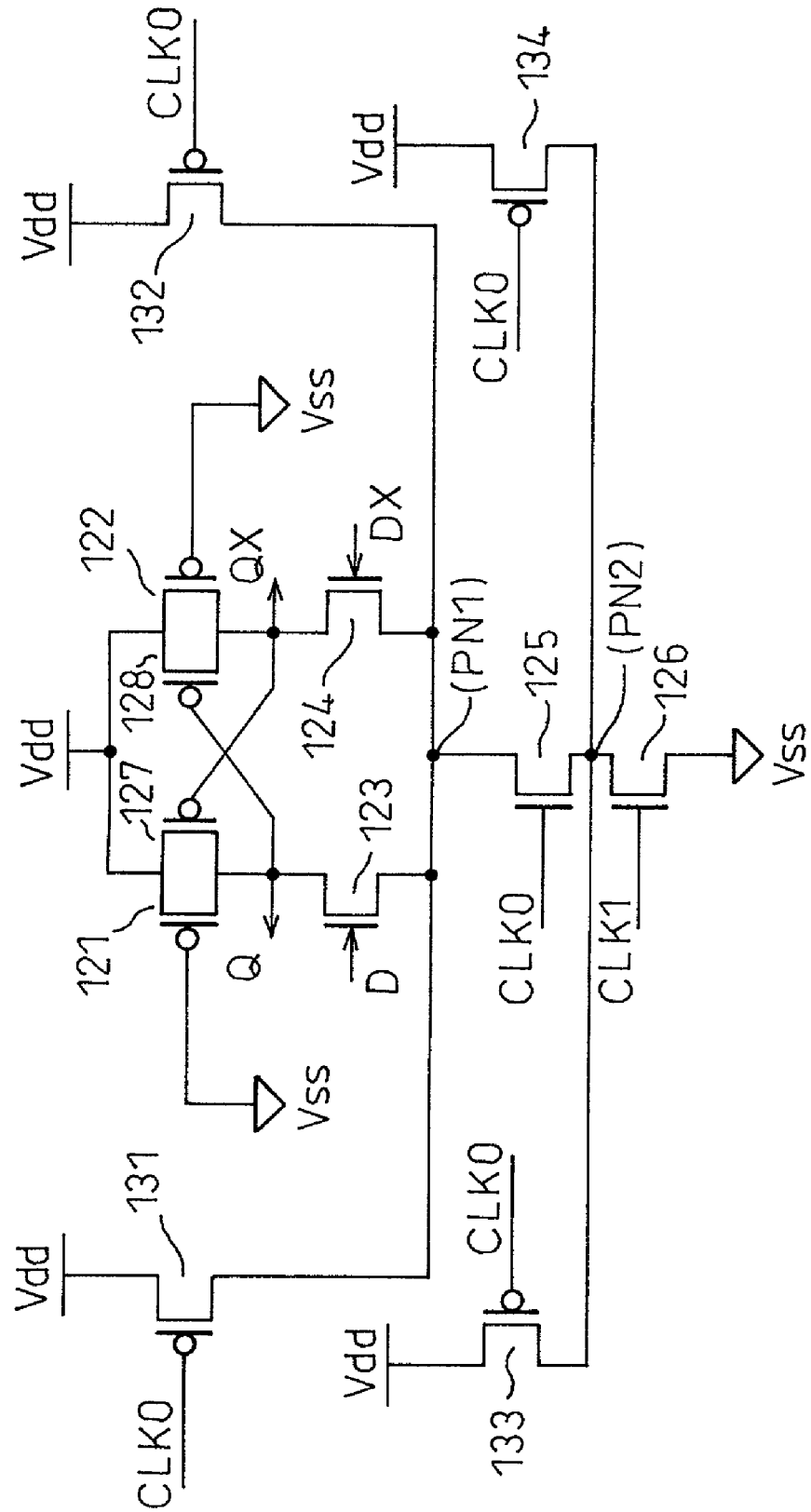
FIG. 19 is a circuit diagram that shows a thirteenth embodiment of a multiplexer cell relating to the present invention.

FIG. 19 is a circuit diagram that shows a thirteenth embodiment of a multiplexer cell relating to the present invention.

According to the multiplexer cell of the thirteenth embodiment, there are further provided pMOS transistors 133 and 134 that pull up a connection node (PN2) of the transistors 125 and 126, in the multiplexer cell of the twelfth embodiment shown in FIG. 18. This is similar to the eighth embodiment shown in FIG. 14, the ninth embodiment shown in FIG. 15, the tenth embodiment shown in FIG. 16, and the eleventh embodiment shown in FIG. 17, respectively. pMOS transistors 131 and 132 pull up a node (PN1) immediately below differential pair of transistors 123 and 124, in a similar manner to that of the tenth embodiment. A clock signal CLK0 that is the same as that supplied to the gate of the transistor 125 is supplied to the gates of these transistors 131 to 134 respectively.

According to the multiplexer cell of the thirteenth embodiment, there are two pull-up positions (a plurality of positions). This is similar to the multiplexer cell of the second embodiment shown in FIG. 7, the ninth embodiment shown in FIG. 15, and the eleventh embodiment shown in FIG. 17, respectively. Therefore, it becomes possible to shorten a transition time of each node (PN1 and PN2) to an initial status. As a result, it becomes possible to realize a higher-speed operation.

Figure 20:
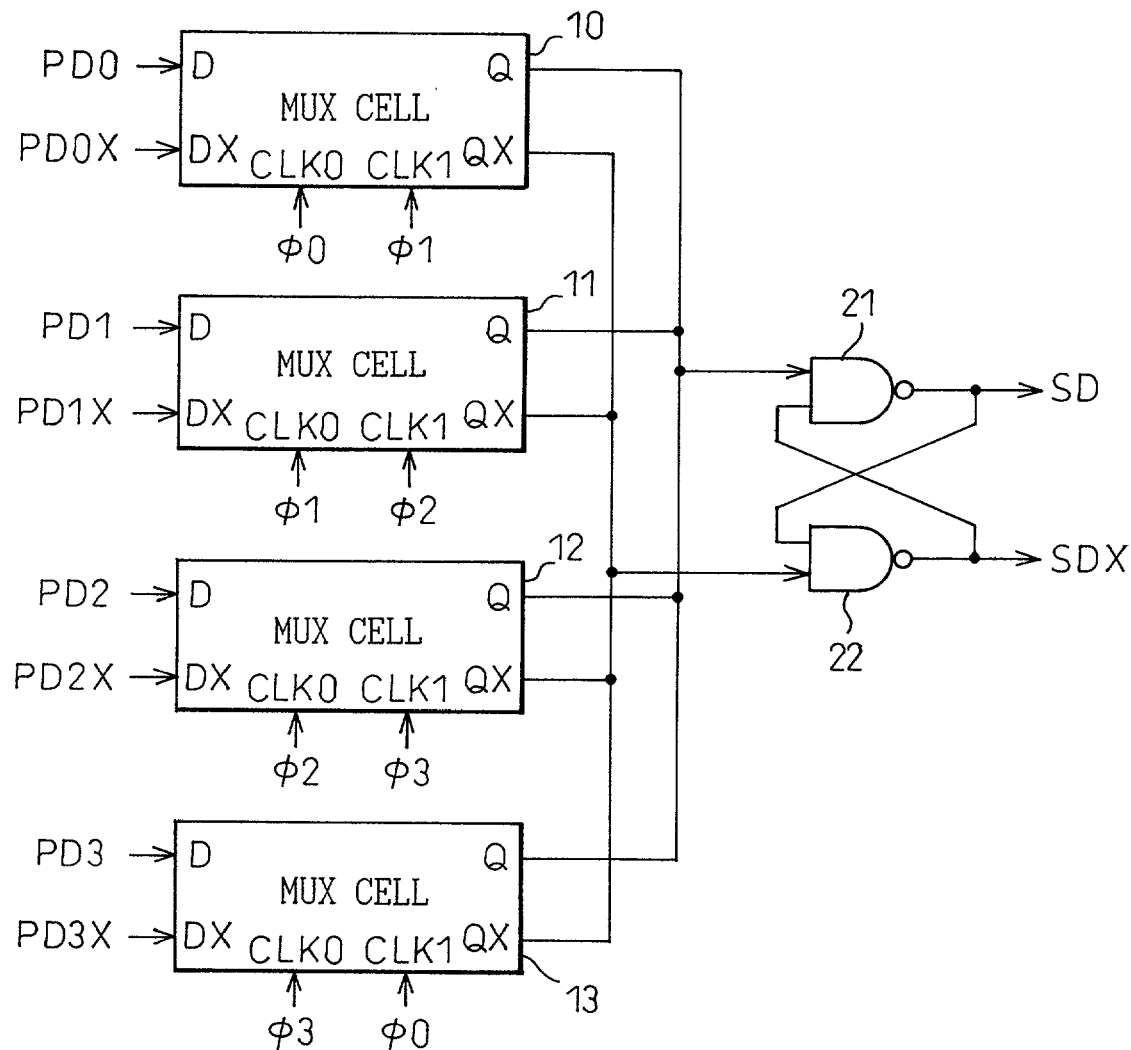
FIG. 20 is a block diagram that shows another example of a total structure of a multiplexer circuit relating to the present invention.

FIG. 20 is a block diagram that shows another example of a total structure of a multiplexer circuit relating to the present invention.

According to the multiplexer circuit shown in FIG. 20, the multiplexers 10 to 13 in the multiplexer circuit shown in FIG. 4 are structured to be able to handle differential (complementary) signals (parallel input data PD0, PD0X to PD3, and PD3X, and serial output data SD and SDX). Further, a flip-flop (latch) that is constructed of two NAND gates 21 and 22 is provided at the outputs of the multiplexers 10 to 13, and this flip-flop holds serial output data SD and SDX.

As explained above, according to the above embodiments of the present invention, a path that directly pulls up a node inside the multiplexer cell is introduced. Based on this arrangement, it is possible to improve the operation band of the multiplexer circuit. Further, a reduction in the number of stages of the nMOS transistors of the pull-up path is advantageous for high-speed operation, and it becomes possible to realize a high-speed multiplexer.

As explained above in detail, according to the present invention, it is possible to provide a multiplexer circuit that can convert parallel data into serial data at high speed and in synchronized with a clock signal.

Many different embodiments of the present invention may be constructed without departing from the spirit and scope of the present invention, and it should be understood that the present invention is not limited to the specific embodiments described in this specification, except as defined in the appended claims.

What is claimed is:

1. A multiplexer circuit, having a plurality of multiplexer cells that receive parallel data, for converting the parallel data into serial data, and synchronized with a clock signal, wherein each of said multiplexer cells comprises:
   a first load and a plurality of first conductivity type transistors that are connected in series between a first power source line and a second power source line; and
   a level-changing circuit that changes a connection node of adjacent first conductivity type transistors to a level of said first power source line,
   wherein a plurality of said level-changing circuits are provided at different positions of the connection node of said adjacent first conductivity type transistors.

2. The multiplexer circuit as claimed in claim 1, wherein said multiplexer circuit takes out an output of each of said multiplexer cells from a connection node of said first load and said first conductivity type transistors that are connected in series.

3. The multiplexer circuit as claimed in claim 1, wherein each of said multiplexer cells is formed as a differential circuit that processes differential signals.

4. The multiplexer circuit as claimed in claim 1, further comprising a latching circuit that is provided at the outputs of said plurality of multiplexer cells.

5. The multiplexer circuit as claimed in claim 1, wherein said first power source line is a high-potential power source line, said second power source line is a low-potential power source line, and said first conductivity type transistor is an nMOS transistor.

6. The multiplexer circuit as claimed in claim 5, wherein said first load is formed by a second conductivity type transistor, said second conductivity type transistor being a pMOS transistor.

7. A multiplexer circuit, having a plurality of multiplexer cells that receive parallel data, for converting the parallel data into serial data, and synchronized with a clock signal, wherein each of said multiplexer cells comprises:
   a first load and a plurality of first conductivity type transistors that are connected in series between a first power source line and a second power source line; and
   a level-changing circuit that changes a connection node of adjacent first conductivity type transistors to a level of said first power source line,
   wherein said level-changing circuit is formed by at least one second conductivity type transistor that is connected to said first power source line.

8. A multiplexer circuit, having a plurality of multiplexer cells that receive parallel data, for converting the parallel data into serial data, and synchronized with a clock signal, wherein each of said multiplexer cells comprises:
   a first load and a plurality of first conductivity type transistors that are connected in series between a first power source line and a second power source line; and
   a level-changing circuit that changes a connection node of adjacent first conductivity type transistors to a level of said first power source line,
   wherein said first load is formed by a second conductivity type transistor.

9. A multiplexer circuit, having a plurality of multiplexer cells that receive parallel data, for converting the parallel data into serial data, and synchronized with a clock signal, wherein each of said multiplexer cells comprises:

a first load and a plurality of first conductivity type transistors that are connected in series between a first power source line and a second power source line; and a level-changing circuit that changes a connection node of adjacent first conductivity type transistors to a level of said first power source line, wherein said level-changing circuit is formed by a second load that is connected to said first power source line and at least one first conductivity type transistor that is connected in series with said second load, and said second load is formed by a second conductivity type transistor.

10. A multiplexer circuit, having a plurality of multiplexer cells that receive parallel data, for converting the parallel data into serial data, and synchronized with a clock signal, wherein each of said multiplexer cells comprises:

a first load and a plurality of first conductivity type transistors that are connected in series between a first power source line and a second power source line; and a level-changing circuit that changes a connection node of adjacent first conductivity type transistors to a level of said first power source line, wherein said level-changing circuit is formed by a second load that is connected to said first power source line and at least one first conductivity type transistor that is connected in series with said second load, and said first and second loads are formed by second conductivity type transistors that are connected by cross coupling.

11. A multiplexer circuit, having a plurality of multiplexer cells that receive parallel data, for converting the parallel data into serial data, and synchronized with a clock signal, wherein each of said multiplexer cells comprises:

a first load and a plurality of first conductivity type transistors that are connected in series between a first power source line and a second power source line; and a level-changing circuit that changes a connection node of adjacent first conductivity type transistors to a level of said first power source line, wherein said level-changing circuit is formed by a second load that is connected to said first power source line and at least one first conductivity type transistor that is connected in series with said second load, and said first and second loads are formed by a parallel layout of second conductivity type transistors that are connected by cross coupling and second conductivity type transistors that are not connected by cross coupling.

12. A multiplexer circuit, having a plurality of multiplexer cells that receive parallel data, for converting the parallel data into serial data, and synchronized with a clock signal, wherein each of said multiplexer cells comprises:

a first load and a plurality of first conductivity type transistors that are connected in series between a first power source line and a second power source line; and a level-changing circuit that changes a connection node of adjacent first conductivity type transistors to a level of said first power source line, wherein said level-changing circuit is formed by a second load that is connected to said first power source line and at least one first conductivity type transistor that is connected in series with said second load, and said first and second loads are formed by second conductivity type transistors.

13. A multiplexer circuit as claimed, having a plurality of multiplexer cells that receive parallel data, for converting the parallel data into serial data, and synchronized with a clock signal, wherein each of said multiplexer cells comprises:

a first load and a plurality of first conductivity type transistors that are connected in series between a first power source line and a second power source line; and a level-changing circuit that changes a connection node of adjacent first conductivity type transistors to a level of said first power source line, wherein said level-changing circuit is formed by a second load that is connected to said first power source line and at least one first conductivity type transistor that is connected in series with said second load, and said level-changing circuit is formed by two second conductivity type transistors that are connected to said first power source line.

14. A multiplexer circuit, having a plurality of multiplexer cells that receive parallel data, for converting the parallel data into serial data, and synchronized with a clock signal, wherein each of said multiplexer cells comprises:

a first load and a plurality of first conductivity type transistors that are connected in series between a first power source line and a second power source line; and a level-changing circuit that changes a connection node of adjacent first conductivity type transistors to a level of said first power source line, wherein said multiplexer cells are four multiplexer cells that are controlled based on four-phase clock signals.

* * * * *